United States Patent
Song et al.

(10) Patent No.: US 12,185,564 B2
(45) Date of Patent: Dec. 31, 2024

(54) DISPLAY PANEL INCLUDING A DAM IN A NON-DISPLAY AREA

(71) Applicant: Samsung Display Co., Ltd., Yongin-si (KR)

(72) Inventors: Chang Min Song, Anyang-si (KR); Kyung Min Park, Seongnam-si (KR); Dong Yoon So, Hwaseong-si (KR); Young Dae Yi, Cheonan-si (KR); Jae Ho Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 73 days.

(21) Appl. No.: 17/229,319

(22) Filed: Apr. 13, 2021

(65) Prior Publication Data

US 2022/0059798 A1 Feb. 24, 2022

(30) Foreign Application Priority Data

Aug. 19, 2020 (KR) .......................... 10-2020-0103922

(51) Int. Cl.
| | |
|---|---|
| *H10K 50/844* | (2023.01) |
| *G06F 3/041* | (2006.01) |
| *H10K 59/12* | (2023.01) |
| *H10K 59/122* | (2023.01) |
| *H10K 59/124* | (2023.01) |
| *H10K 59/40* | (2023.01) |
| *H10K 71/00* | (2023.01) |

(52) U.S. Cl.
CPC ......... *H10K 50/844* (2023.02); *G06F 3/0412* (2013.01); *H10K 59/122* (2023.02); *H10K 59/124* (2023.02); *H10K 71/00* (2023.02); *H10K 59/1201* (2023.02); *H10K 59/40* (2023.02); *H10K 71/851* (2023.02)

(58) Field of Classification Search
CPC .. H10K 50/844; H10K 59/122; H10K 59/124; H10K 59/1201; H10K 59/40; H10K 71/00; H10K 71/851; G06F 3/0412
USPC ......................................... 257/40, 59
See application file for complete search history.

(56) References Cited

U.S. PATENT DOCUMENTS

| | | | |
|---|---|---|---|
| 2017/0117502 A1* | 4/2017 | Park | H10K 59/124 |
| 2018/0059855 A1* | 3/2018 | Gwon | G06F 3/04164 |
| 2018/0138450 A1* | 5/2018 | Park | H10K 59/35 |
| 2019/0036063 A1* | 1/2019 | Lee | H10K 59/40 |
| 2021/0257589 A1* | 8/2021 | Wang | H10K 59/00 |

FOREIGN PATENT DOCUMENTS

| | | |
|---|---|---|
| KR | 10-2014-0009920 A | 1/2014 |
| KR | 10-2017-0047452 A | 5/2017 |
| KR | 10-2018-0032742 A | 4/2018 |
| KR | 10-2020-0063377 A | 6/2020 |

* cited by examiner

*Primary Examiner* — Lex H Malsawma
*Assistant Examiner* — Eric W Jones
(74) *Attorney, Agent, or Firm* — Lewis Roca Rothgerber Christie LLP

(57) ABSTRACT

A display panel includes a substrate, light emitting elements in a display area of the substrate, and configured to emit light, an organic encapsulation layer on the light emitting elements, a first dam in a non-display area of the substrate, and organic patterns spaced apart from each other outside the first dam in the non-display area of the substrate, and including a first organic pattern and a second organic pattern adjacent to each other and having a gap therebetween.

17 Claims, 18 Drawing Sheets

FIG. 4A
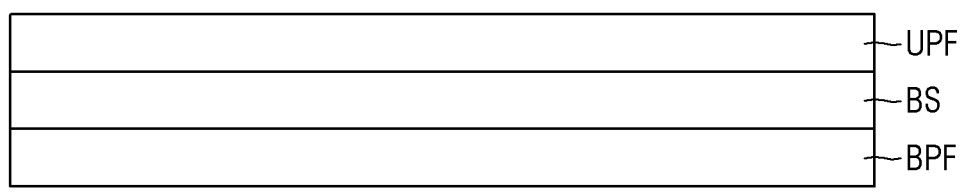
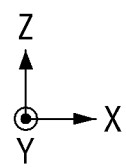
FIG. 4B
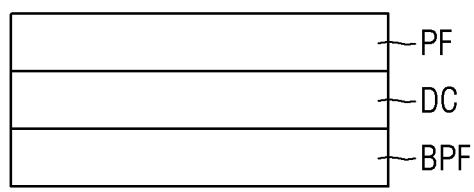
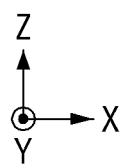

DISPLAY PANEL INCLUDING A DAM IN A NON-DISPLAY AREA

CROSS-REFERENCE TO RELATED APPLICATION

This application claims priority to, and the benefit of, Korean Patent Application No. 10-2020-0103922, filed on Aug. 19, 2020, in the Korean Intellectual Property Office (KIPO), the entire content of which is incorporated by reference herein.

BACKGROUND

1. Field

The present disclosure relates to a display panel, and a method for manufacturing the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may include a flat panel display panel such as a liquid crystal display panel, a field emission display panel, a light emitting display panel, and the like. The light emitting display panel may be an organic light emitting display panel including an organic light emitting diode as a light emitting element, an inorganic light emitting display panel including an inorganic semiconductor as a light emitting element, or a micro light emitting diode display panel including a micro light emitting diode or a nano light emitting diode as a light emitting element.

During the manufacturing process, to protect the top surface of the display panel on which an image is displayed, an upper protective film may be attached onto the top surface of the display panel. Bubbles may exist between the upper protective film and the display panel due to a level difference between metal lines on the top surface of the display panel.

After attaching the upper protective film, image quality inspection of the display panel may be performed. In the image quality inspection, an image quality defect of the display panel due to bubbles may be visually recognized. However, it may be difficult to determine whether the image quality defect is an image quality defect due to bubbles or an image quality defect of the display panel.

SUMMARY

Aspects of some embodiments of the present disclosure provide a display panel that can prevent visual recognition of an image quality defect due to bubbles in image quality inspection.

Aspects of some embodiments of the present disclosure provide a method for manufacturing a display panel, which can prevent visual recognition of an image quality defect due to bubbles in image quality inspection.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a display panel including a substrate, light emitting elements in a display area of the substrate, and configured to emit light, an organic encapsulation layer on the light emitting elements, a first dam in a non-display area of the substrate, and organic patterns spaced apart from each other outside the first dam in the non-display area of the substrate, and including a first organic pattern and a second organic pattern adjacent to each other and having a gap therebetween.

The organic patterns may be arranged along an edge of the substrate.

The organic patterns may include an organic material.

A length of the first organic pattern in one direction may be greater than a length of the gap in the one direction.

The substrate may include a first side, a second side, and a corner where the first side and the second side meet, wherein the organic patterns are at the corner.

The display panel may further include touch lines within an inner side of the first dam in the non-display area and on the organic encapsulation layer.

The display panel may further include a polarizing film on and contacting the touch lines.

The display panel may further include a pixel transistor on the substrate and in the display area, a first planarization layer on the pixel transistor, and a second planarization layer on the first planarization layer.

The display panel may further include a bank, wherein each of the light emitting elements includes a pixel electrode on the second planarization layer, a light emitting layer on the pixel electrode, and a common electrode on the light emitting layer, and wherein the bank is on the pixel electrode.

Each of the organic patterns may include a first sub-pattern having a same material as the first planarization layer.

Each of the organic patterns may include a second sub-pattern on the first sub-pattern and having a same material as the second planarization layer.

Each of the organic patterns may include a third sub-pattern on the second sub-pattern and having a same material as the bank.

The first dam may include a first sub-dam having a same material as the first sub-pattern, a second sub-dam on the first sub-dam and having a same material as the second sub-pattern, and a third sub-dam on the second sub-dam and having a same material as the third sub-pattern.

The display panel may further include a second dam in the non-display area of the substrate between the first dam and the organic pattern, wherein the second dam includes a first sub-dam having a same material as the first sub-pattern, a second sub-dam on the first sub-dam and having a same material as the second sub-pattern, a third sub-dam on the second sub-dam and having a same material as the third sub-pattern, and a fourth sub-dam on the third sub-dam.

The display panel may further include a spacer on the bank and having a same material as the fourth sub-dam.

The organic encapsulation layer may be on the first dam, and is not on the organic pattern.

According to some embodiments of the present disclosure, there is provided a method for manufacturing a display panel, the method including attaching an upper protective film to a first surface of a mother substrate, detaching a lower support member from a bottom surface of the mother substrate, attaching a lower protective film to the bottom surface of the mother substrate, forming display cells by cutting the mother substrate along a first cutting line, detaching the upper protective film from the display cell, and attaching a polarizing film to a first surface of the display cell, wherein the display cell includes a passage for discharging bubbles of the upper protective film to an outside.

The display cell may include organic patterns extending in one direction, and arranged in another direction crossing the one direction.

The passage may be between a first organic pattern and a second organic pattern adjacent to each other among the organic patterns.

The attaching of the lower protective film to the bottom surface of the mother substrate may be performed after aligning the lower protective film using first alignment marks on each of the display cells.

The first alignment marks might not overlap the passage.

The first alignment marks may overlap the organic patterns.

The forming of the display cells by cutting the mother substrate along the first cutting line may include cutting the mother substrate using second alignment marks on each of the display cells.

The second alignment marks might not overlap the passage.

The second alignment marks may overlap the organic patterns.

According to the aforementioned and other embodiments of the present disclosure, bubble discharge passages, which are air passages from the edge of the display panel to the outside of the display cell, may be defined by bubble discharge patterns. Accordingly, when a pressure (e.g., predetermined pressure) is applied to the display cell in the bubble removal process, bubbles located between the top surface of the display panel and the upper protective film may be discharged to the outside of the display cell through the bubble discharge passage. Therefore, because the bubbles located between the top surface of the display panel and the upper protective film can be eliminated, it is possible to reduce or prevent an image quality defect due to bubbles from being visually recognized in the image quality inspection.

According to the aforementioned and other embodiments of the present disclosure, when an insulating layer for flattening a stepped portion due to touch lines is not located on the touch lines, although bubbles may occur between the display cell and the upper protective film, the bubbles may be discharged to the outside of the display cell through the bubble discharge passages. Accordingly, because a process of forming an insulating layer for flattening a stepped portion due to the touch lines may be omitted, the manufacturing cost can be reduced.

BRIEF DESCRIPTION OF THE DRAWINGS

The above and other embodiments and features of the present disclosure will become more apparent by describing embodiments thereof with reference to the attached drawings, in which:

FIG. 4A is a diagram showing a mother substrate, an upper protective film, and a lower protective film according to some embodiments;

FIG. 4B is a diagram illustrating a display cell, a polarizing film, and a lower protective film according to some embodiments;

DETAILED DESCRIPTION

Figure 1:
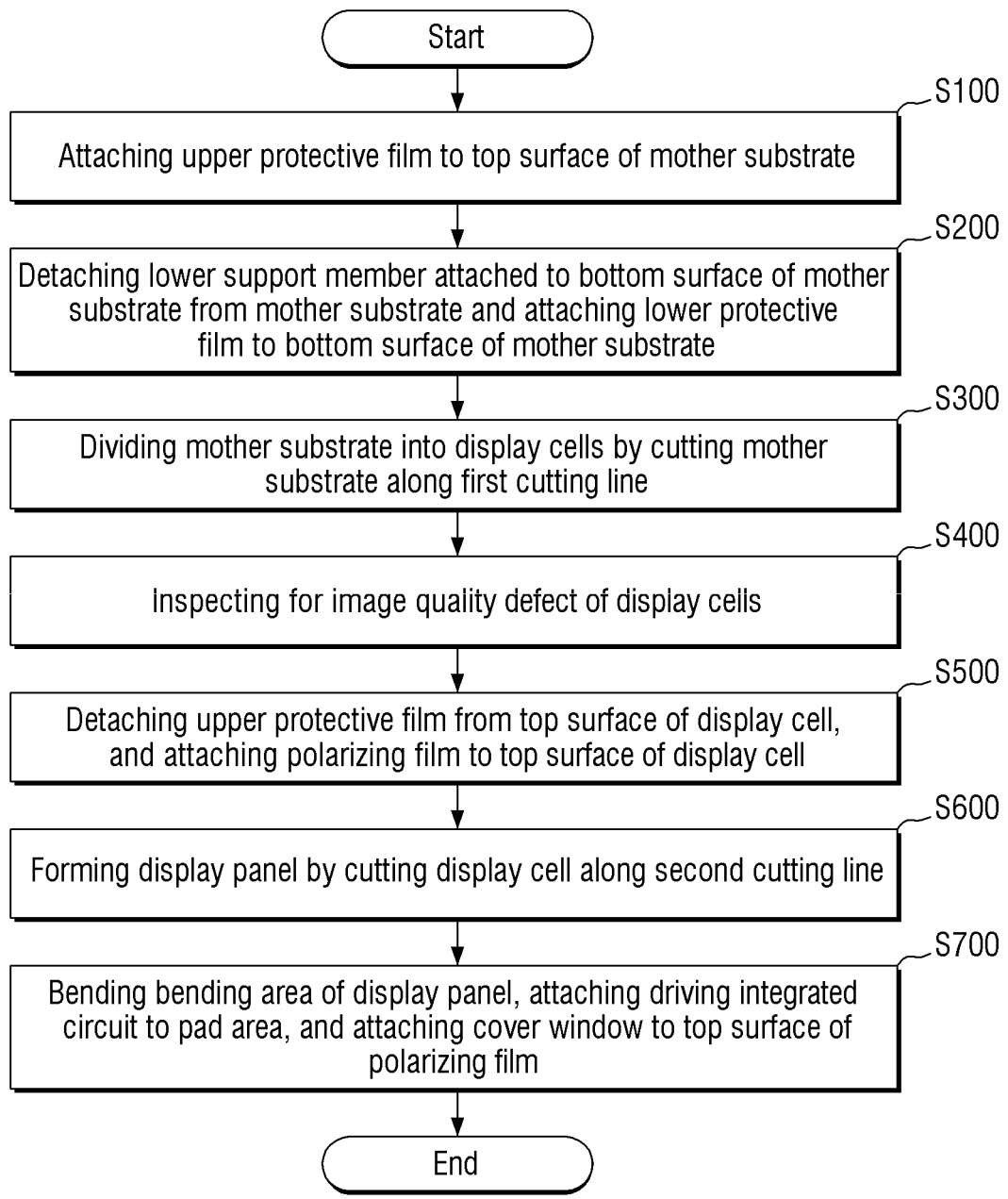
FIG. 1 is a flowchart illustrating a method for manufacturing a display panel according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
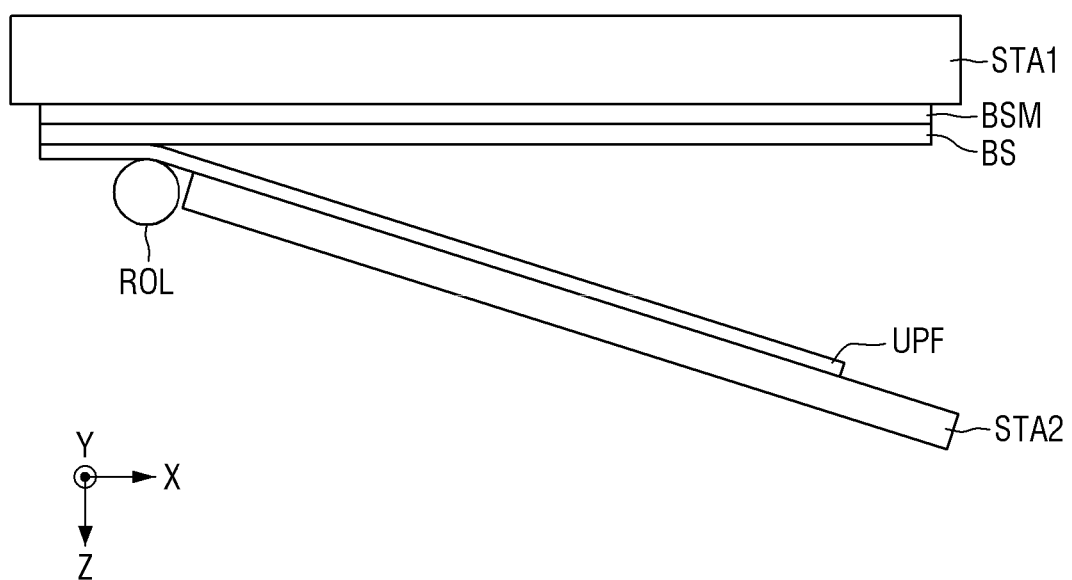
FIG. 2 is a view showing attachment of an upper protective film to a top surface of a mother substrate according to some embodiments.
Figure 3:
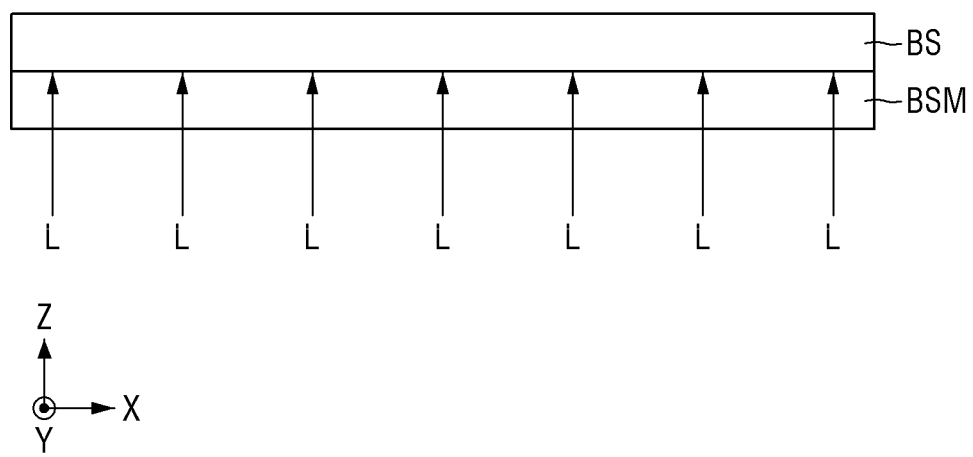
FIG. 3 is a view showing irradiation of a laser on a bottom surface of a mother substrate according to some embodiments.
Figure 5:
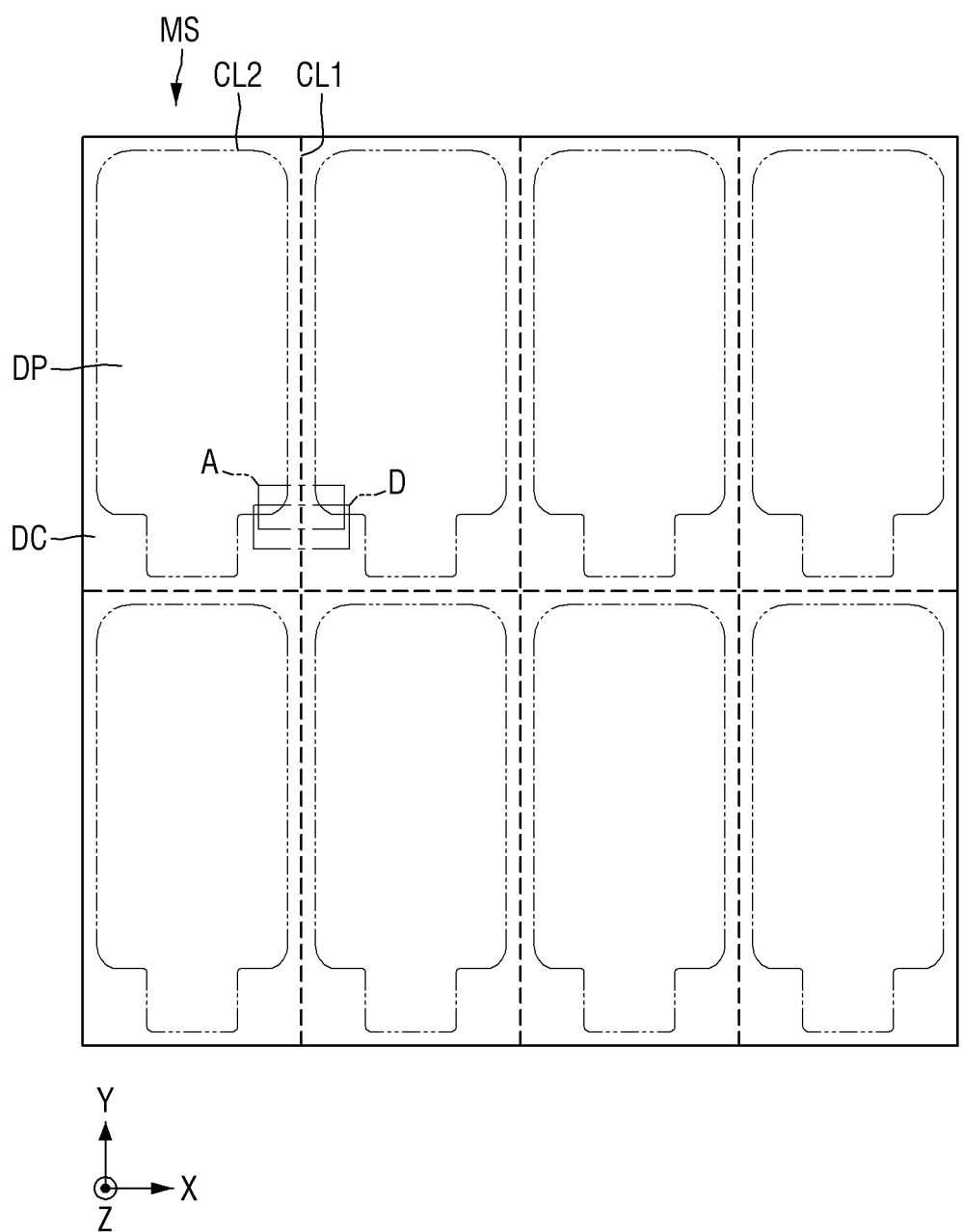
FIG. 5 is a layout diagram showing a mother substrate according to some embodiments.
Figure 6:
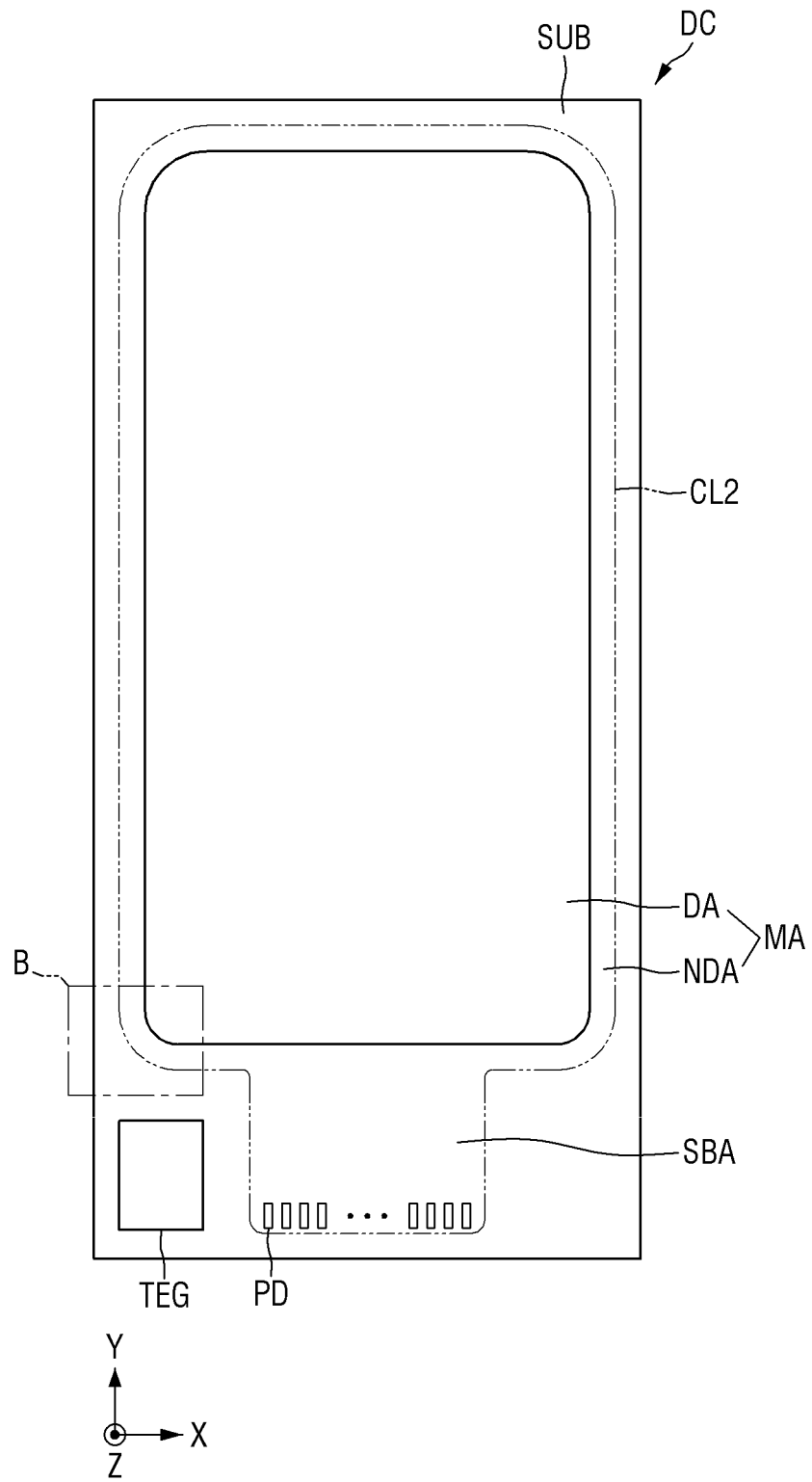
FIG. 6 is a layout diagram illustrating an example of a display cell cut along a first cutting line shown in FIG. 5.
Figure 7:
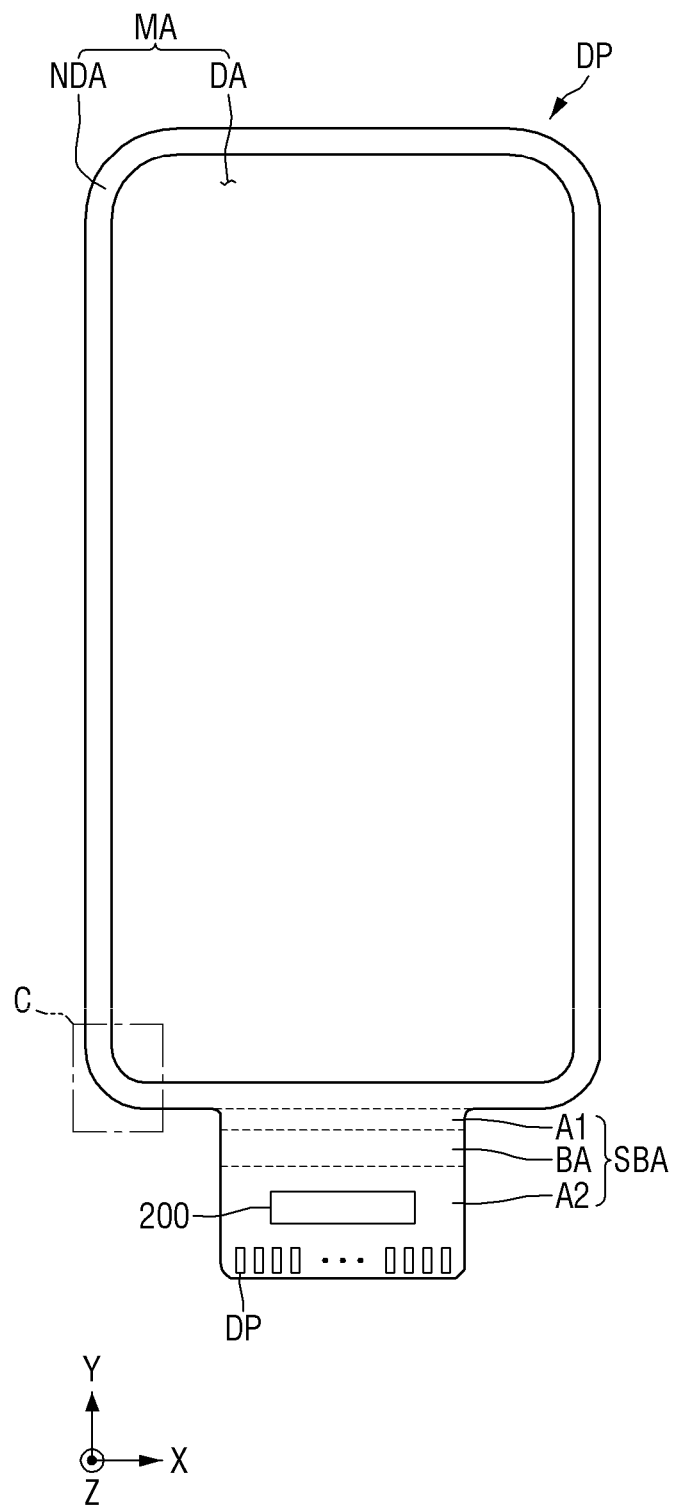
FIGS. 7 and 8 are layout diagrams illustrating an example of a display panel cut along a second cutting line shown in FIG. 6.
Figure 8:
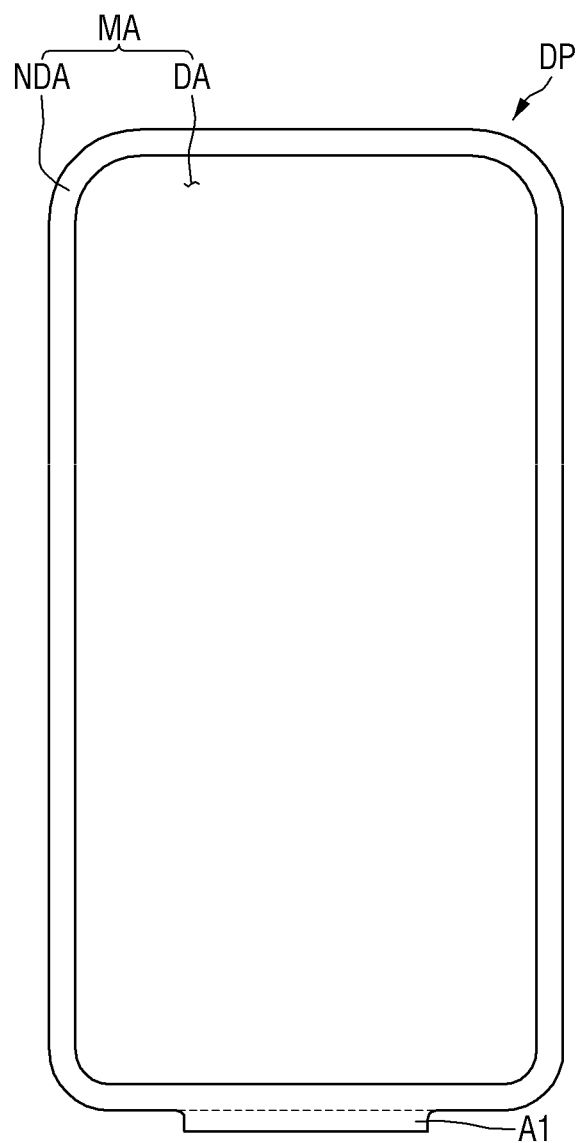

FIG. 1 is a flowchart illustrating a method for manufacturing a display panel according to some embodiments. FIG. 2 is a view showing attachment of an upper protective film to a top surface of a mother substrate according to some embodiments. FIG. 3 is a view showing irradiation of a laser on a bottom surface of a mother substrate according to some embodiments. FIG. 4A is a diagram showing a mother substrate, an upper protective film, and a lower protective film according to some embodiments. FIG. 4B is a diagram illustrating a display cell, a polarizing film, and a lower protective film according to some embodiments. FIG. 5 is a layout diagram showing a mother substrate according to some embodiments. FIG. 6 is a layout diagram illustrating an example of a display cell cut along a first cutting line shown in FIG. 5. FIGS. 7 and 8 are layout diagrams illustrating an example of a display panel cut along a second cutting line shown in FIG. 6.

Hereinafter, a method for manufacturing a display panel according to some embodiments will be described with reference to FIGS. 1 to 8.

Firstly, as shown in FIG. 2, an upper protective film UPF is attached to the top surface of a mother substrate BS (operation S200 in FIG. 1).

The mother substrate BS may be located on a first stage STA1. The mother substrate BS may be fixed to the first stage STA1. In this case, the top surface of the mother substrate BS may face downward.

The upper protective film UPF may be fixed to a second stage STA2. The adhesive surface of the upper protective film UPF may face the top surface of the mother substrate BS. The upper protective film UPF may be attached while being pressed to the top surface of the mother substrate BS by a roller ROL while being sequentially detached from the second stage STA2 from one end to the other end.

Secondly, as shown in FIGS. 3 and 4A, a lower support member BSM attached to the bottom surface of the mother substrate BS is detached from the mother substrate BS, and a lower protective film BPF is attached to the bottom surface of the mother substrate BS (operation S200 in FIG. 1).

The lower support member BSM may be made of glass or plastic. The bottom surface of the lower support member BSM may be cleaned to remove foreign matter from the bottom surface of the lower support member BSM. When foreign matter exists on the bottom surface of the lower support member BSM, a laser L may be scattered by the foreign matter. In this case, it may be suitable for the adhesive strength at the interface between the mother substrate BS and the lower support member BSM to not be lowered by the laser L, which may make it more difficult to detach the lower support member BSM.

After cleaning the bottom surface of the lower support member BSM, the laser L is irradiated onto the bottom surface of the lower support member BSM. Then, the lower support member BSM is detached from the mother substrate BS. Then, the lower protective film BPF may be attached to the bottom surface of the mother substrate BS. A method of attaching the lower protective film BPF may be similar to the method of attaching the upper protective film UPF described with reference to FIG. 2. The adhesive strength of the lower protective film BPF may be higher than the adhesive strength of the upper protective film UPF.

Thirdly, as shown in FIGS. 5 and 6, the mother substrate BS may be cut along a first cutting line CL1 to divide the mother substrate BS into a plurality of display cells DC (operation S300 in FIG. 1).

The mother substrate BS may include the plurality of display cells DC separated by the first cutting line CL1 as shown in FIG. 5. The plurality of display cells DC may be arranged in a first direction (X-axis direction) and a second direction (Y-axis direction).

Each of the plurality of display cells DC includes a display panel DP separated by a second cutting line CL2 as shown in FIGS. 5 and 6. In addition, each of the plurality of display cells DC may include a test pad area TEG for applying voltages to wirings of the display panel DP as shown in FIG. 6.

The test pad area TEG may include test pads electrically connected to display pads PD of the display panel DP. Accordingly, voltages applied to the test pads in the test pad area TEG may be applied to the wirings through the display pads PD of the display panel DP.

The mother substrate BS may be cut using a laser, but is not limited thereto. For example, the mother substrate BS may be cut using a cutting unit capable of cutting glass or plastic.

In addition, to eliminate bubbles formed between the bottom surface of the display cell DC and the lower protective film BPF, a void removing process in which an atmospheric pressure (e.g., a predetermined atmospheric pressure) is applied to the display cell DC at a temperature (e.g., a predetermined temperature) for a period (e.g., a predetermined period) may be added. For example, in a bubble removal process, a pressure that is about 8 times the atmospheric pressure (e.g., 8 atmospheric pressure) may be applied to the display cell DC at approximately 50° C. for a period (e.g., a predetermined period).

Also, to stabilize the driving of the display panel DP of the display cell DC, a high potential voltage may be applied to the wirings of the display panel DP through the test pad area TEG (e.g., for a predetermined period).

Fourthly, an image quality defect of the display panel DP of the display cell DC is inspected (operation S400 in FIG. 1).

Because the test pad area TEG includes test pads electrically connected to the display pads PD of the display panel DP, voltages may be applied to the wirings of the display panel DP by applying voltages to the test pads in the test pad area TEG. The display panel DP may display various images according to applied voltages. It may be checked whether there is an image quality defect in various images displayed by the display panel DP.

Fifthly, the upper protective film UPF is detached from the top surface of the display cell DC, and a polarizing film PF is attached to the top surface of the display cell DC as shown in FIG. 4B (operation S500 in FIG. 1).

The upper protective film UPF serves to protect the upper portion of the display cell DC during the manufacturing process before attaching the polarizing film PF. The polarizing film PF may reduce or prevent visibility of an image displayed by the display panel DP from deteriorating due to reflection of external light by metal lines of the display panel DP. The polarizing film PF may include a first base member, a linear polarization plate, a phase retardation film such as a λ/4 (quarter-wave) plate and/or a λ/2 (half-wave) plate, and a second base member. A method of attaching the polarizing film PF may be similar to the method of attaching the upper protective film UPF described with reference to FIG. 2.

Sixthly, as shown in FIG. 7, the display cell DC is cut along the second cutting line CL2 to form the display panel DP (operation S600 in FIG. 1).

The display panel DP may include a main region MA and a sub-region SBA. The main region MA may have a rectangular shape having first sides extending in the first direction (X-axis direction) and second sides extending in the second direction (Y-axis direction). FIGS. 7 and 8 illustrate that the length of the first side is smaller than the length of the second side, but the present disclosure is not limited thereto. The length of the first side may be the same as the length of the second side, or may be greater than the length of the second side. The corner where the first side in the first direction (X-axis direction) and the second side in the second direction (Y-axis direction) meet may be rounded to have a curvature (e.g., a predetermined curvature), but is not limited thereto. For example, the corner may be substantially right-angled.

The main region MA may include a display area DA displaying an image, and a non-display area NDA that is a peripheral area of the display area DA. The display area DA may occupy most of the main region MA. The display area DA may be located at the center of the main region MA. The display area DA may include scan lines extending in the first direction (X-axis direction), data lines extending in the second direction (Y-axis direction), and pixels. Each of the pixels is connected to the scan line and the data line, and when a scan signal is applied to the scan line, it may receive a data voltage from the data line. Each of the pixels may emit light using the light emitting element according to the data voltage.

The non-display area NDA may be located adjacent to the display area DA. The non-display area NDA may be an area outside the display area DA. The non-display area NDA may surround the display area DA. The non-display area NDA may be an edge area of the display panel DP.

The sub-region SBA may protrude in the second direction (Y-axis direction) from one side of the main region MA. The length of the sub-region SBA in the second direction (Y-axis direction) may be less than the length of the main region MA in the second direction (Y-axis direction). The length of the sub-region SBA in the first direction (X-axis direction) may be substantially equal to, or less than, the length of the main region MA in the first direction (X-axis direction). The sub-region SBA may be bent so as to be placed on, or adjacent to, the back surface of the display panel DP. In this case, the sub-region SBA may overlap the main region MA in the third direction (Z-axis direction).

The sub-region SBA may include a first area A1, a second area A2, and a bending area BA.

The first area A1 is a region protruding from one side of the main region MA in the second direction (Y-axis direction). One side of the first area A1 may contact the non-display area NDA of the main region MA, and the other side of the first region A1 may contact the bending area BA.

Because the second area A2 is an area in which the display pads PD are located, it may be referred to as a pad area. One side of the second area A2 may contact the bending area BA. The display pads PD may be electrically connected to a circuit board using a low-resistance, high-reliability material such as an anisotropic conductive film or SAP.

The bending area BA is an area for being bent. It is shown in FIG. 7 that the bending area BA is unfolded without being bent. It is shown in FIG. 8 that the bending area BA is bent. When the bending area BA is bent, the second area A2 may be located under the first area A1 and under the main region MA. The bending area BA may be located between the first area A1 and the second area A2. One side of the bending area BA may contact the first area A1, and the other side of the bending area BA may contact the second area A2.

Seventhly, as shown in FIG. 8, the bending area BA of the display panel DP is bent, and a driving integrated circuit DIC is attached to the second area A2 as shown in FIG. 7.

When the bending area BA is bent, the second area A2 may be located under the main region MA. An adhesive member for bonding the main region MA to the second area A2 may be located between the main region MA and the second area A2.

The driving integrated circuit DIC may be attached to driving pads of the second area A2 using a low-resistance high-reliability material such as self-assembly anisotropic conductive paste (SAP) or an anisotropic conductive film.

Meanwhile, because the upper protective film UPF serves to temporarily protect the upper portion of the display cell DC before attaching the polarizing film PF, the adhesive strength of the upper protective film UPF is weaker than that of the lower protective film BPF. In addition, due to the wirings and electrodes located on the top surface of the display cell DC, the level difference, or step difference, on the top surface is larger than the level difference on the bottom surface, and the evenness of the top surface is lower than, or less than, the evenness of the bottom surface. For this reason, more bubbles may exist between the top surface of the display cell DC and the upper protective film UPF than between the bottom surface of the display cell DC and the lower protective film BPF. Bubbles between the bottom surface of the display cell DC and the lower protective film BPF may be removed in the bubble removal process. However, bubbles generated between the top surface of the display cell DC and the upper protective film UPF may coalesce during the bubble removal process and grow into larger bubbles.

Bubbles between the top surface of the display cell DC and the upper protective film UPF may be recognized as an image quality defect in the image quality inspection operation S400. Because the upper protective film UPF serves to temporarily protect the upper portion of the display cell DC before attaching the polarizing film PF, the image quality defect due to bubbles between the top surface of the display cell DC and the upper protective film UPF should be distinguished from the image quality defect of the display panel DP. However, it may be difficult to distinguish between the image quality defect due to bubbles and the image quality defect of the display panel DP. Therefore, it may be suitable to reduce or prevent visual recognition of the image quality defect due to bubbles in the image quality inspection.

Figure 9:
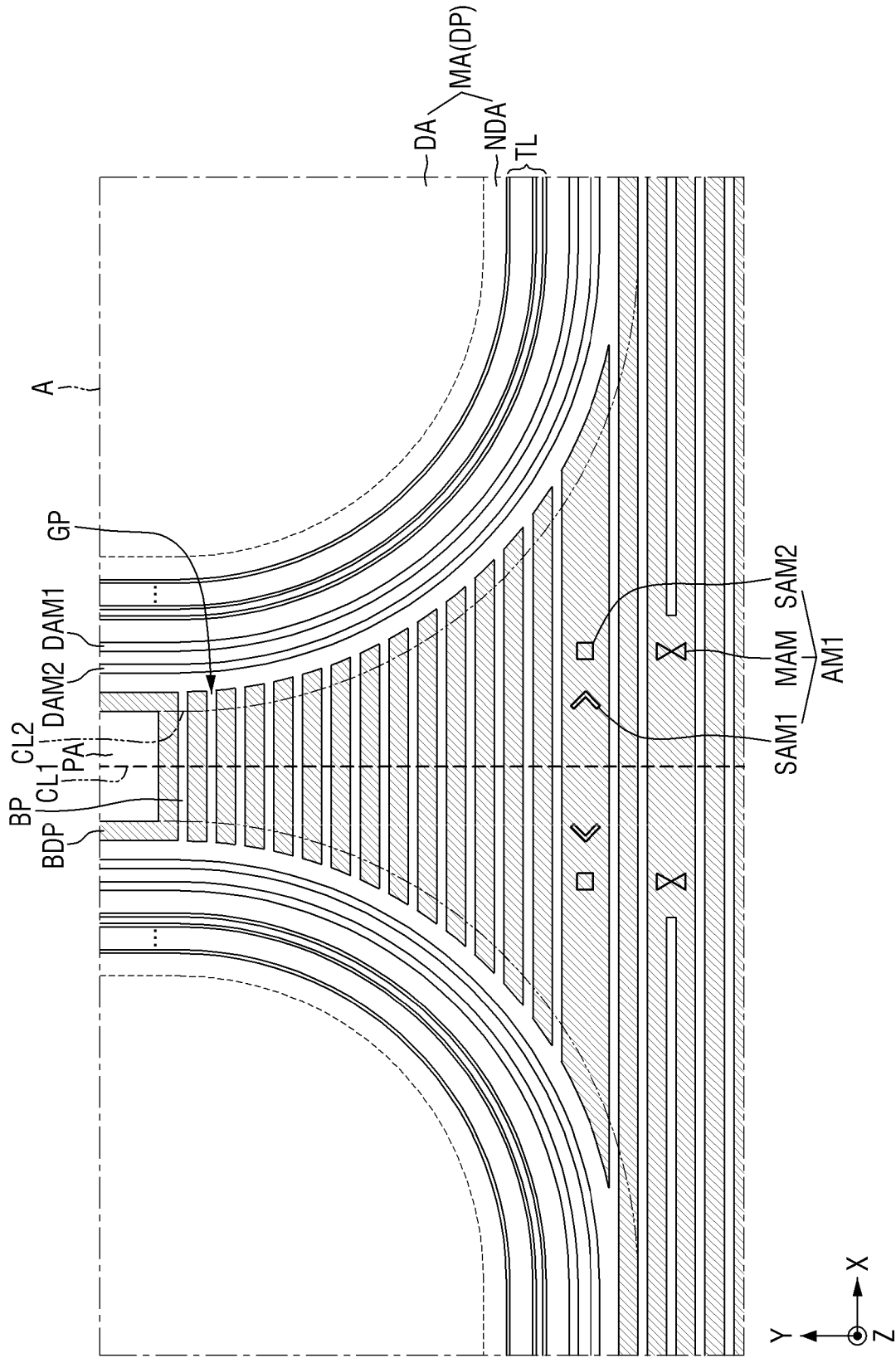
FIG. 9 is a layout diagram showing in detail an example of area A of FIG. 5.
Figure 10:
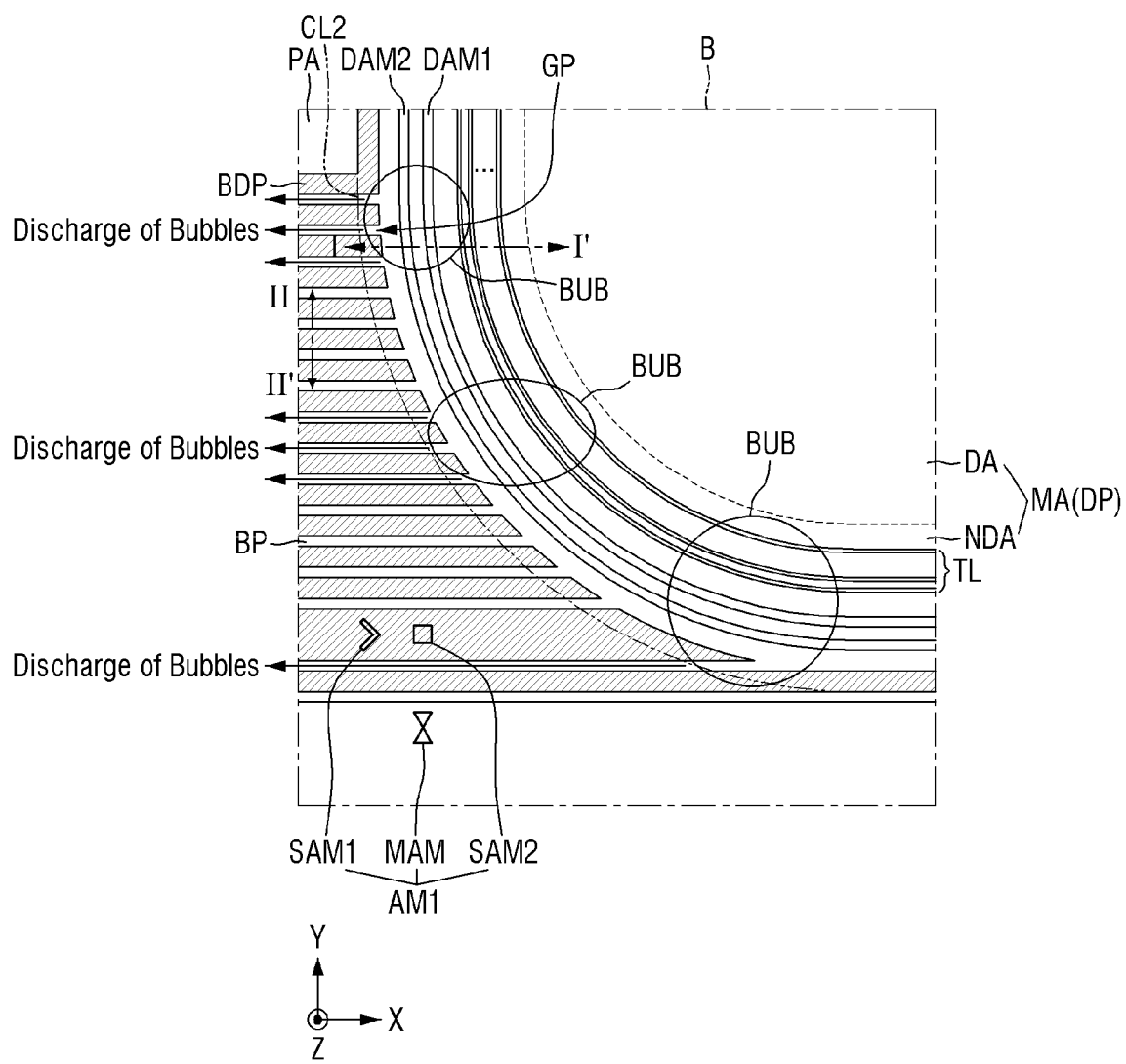
FIG. 10 is a layout diagram showing in detail an example of area B of FIG. 6.
Figure 11:
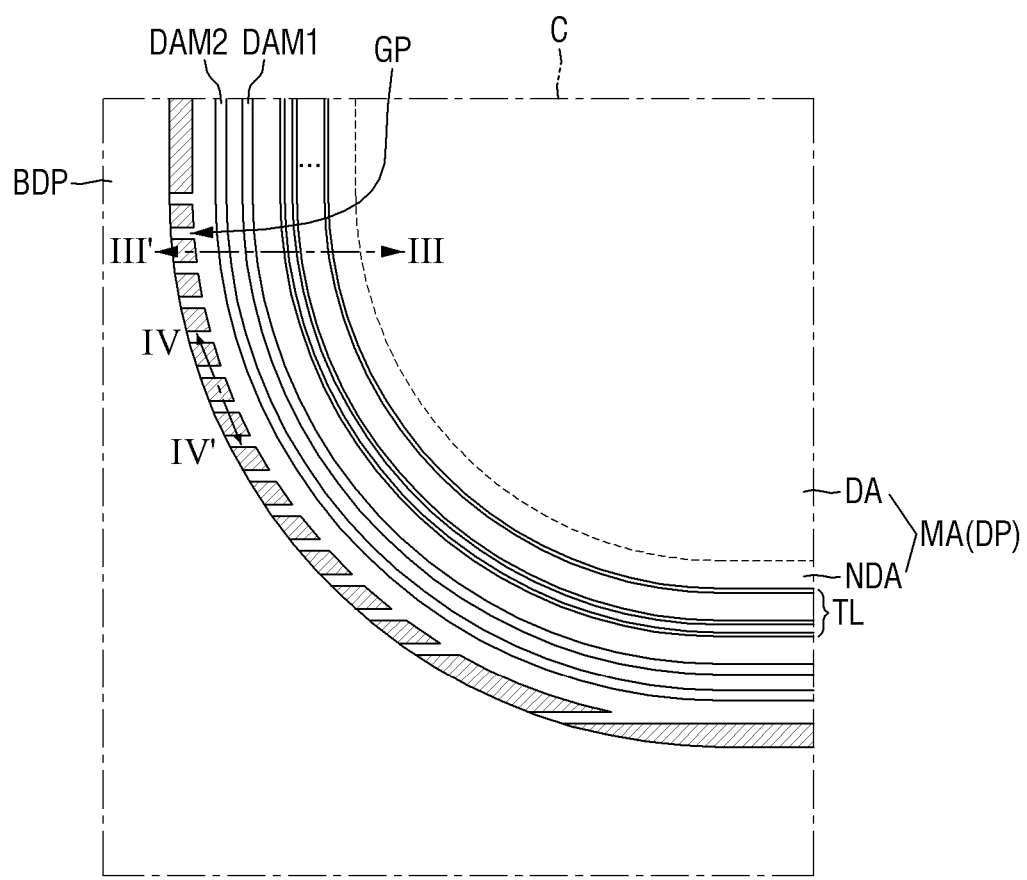
FIG. 11 is a layout diagram showing in detail an example of area C of FIG. 7.

FIG. 9 is a layout diagram showing in detail an example of area A of FIG. 5. FIG. 10 is a layout diagram showing in detail an example of area B of FIG. 6. FIG. 11 is a layout diagram showing in detail an example of area C of FIG. 7.

Referring to FIGS. 9 to 11, the mother substrate BS includes the display cells DC defined by the first cutting line CL1. Each of the display cells DC includes a display panel DP defined by a second cutting line CL2, and a peripheral area PA (see FIG. 12) that is an area other than the display panel DP. Each of the display cells DC includes bubble discharge patterns BDP, bubble discharge passages BP, and first alignment marks AM1.

As shown in FIGS. 9 and 10, the bubble discharge patterns BDP may be located in the peripheral area PA and the non-display area NDA of the display panel DP. The bubble discharge patterns BDP may extend in the first direction (X-axis direction) in the peripheral area PA. The bubble discharge patterns BDP may be arranged in the second direction (Y-axis direction) crossing the first direction (X-axis direction) in the peripheral area PA. A space between the adjacent bubble discharge patterns BDP in the second direction (Y-axis direction) may be defined as the bubble discharge passage BP.

As shown in FIGS. 9 to 11, when the display cell DC is cut along the second cutting line CL2, most of the bubble discharge patterns BDP are located in the peripheral area PA, and thus a part of the bubble discharge patterns BDP may remain in the display panel DP. The bubble discharge patterns BDP may be arranged along the edge of the display panel DP. The bubble discharge patterns BDP located at the corners of the display panel DP (or the substrate SUB of the display panel DP) may be located in an island shape. A gap GP may exist between the bubble discharge patterns BDP adjacent to each other. The gap GP may be a part of the bubble discharge passage BP.

The bubble discharge passage BP may be an air passage from the edge of the display panel DP to the outside of the display cell DC. Accordingly, when a pressure (e.g., predetermined pressure) is applied to the display cell DC in the bubble removal process, bubbles BUB located between the top surface of the display panel DP and the upper protective film UPF may be discharged to the outside of the display cell DC through the bubble discharge passage BP as shown in FIG. 10.

Although FIGS. 9 to 11 illustrate that the bubble discharge patterns BDP located on the first side in the first direction (X-axis direction) and the second side in the second direction (Y-axis direction) of the main region MA of the display panel DP are continuous without being disconnected, the present disclosure is not limited thereto. The bubble discharge patterns BDP located on the first side in the first direction (X-axis direction) and the second side in the second direction (Y-axis direction) of the main region MA of the display panel DP may also be arranged in island shapes.

The length, which may also be referred to as width, of a bubble discharge pattern BDP in the second direction (Y-axis direction) may be greater than that of a bubble discharge passage BP in the second direction (Y-axis direction). For example, the length of the bubble discharge pattern BDP in the second direction (Y-axis direction) may be greater than about 200 μm, and the length of the bubble discharge passage BP in the second direction (Y-axis direction) may be approximately 50 μm to 200 μm.

The first alignment marks AM1 may be located in the peripheral area PA. When attaching the lower protective film BPF, the first alignment marks AM1 may be marks used to align the mother substrate BS and the lower protective film BPF.

When the first alignment marks AM1 are located in the bubble discharge passage BP, the first alignment marks AM1 might not be visible due to bubbles. Therefore, the first alignment marks AM1 suitably may be located outside of the bubble discharge passage BP. That is, the first alignment marks AM1 may overlap the bubble discharge patterns BDP without overlapping the bubble discharge passage BP. In this case, the length in the second direction (Y-axis direction) of a bubble discharge pattern BDP overlapping at least one of the first alignment marks AM1 may be greater than the length in the second direction (Y-axis direction) of a bubble discharge pattern BDP that does not overlap the first alignment marks AM1.

The first alignment marks AM1 include a main alignment mark MAM, a first sub-alignment mark SAM1, and a second sub-alignment mark SAM2.

Although it is illustrated that the main alignment mark MAM has an hourglass shape in a plan view, the planar shape of the main alignment mark MAM is not limited thereto. Although it is shown that the first sub-alignment mark SAM1 has a staple shape ("<" or ">") in a plan view, the planar shape of the first sub-alignment mark SAM1 is not limited thereto. Although it is illustrated that the second sub-alignment mark SAM2 has a rectangular shape in a plan view, the planar shape of the second sub-alignment mark SAM2 is not limited thereto.

The length of the main alignment mark MAM in the second direction (Y-axis direction) may be greater than the length of the first sub-alignment mark SAM1 in the second direction (Y-axis direction), and may be greater than the length of the second sub-alignment mark SAM2 in the second direction (Y-axis direction).

The first sub-alignment mark SAM1 and the second sub-alignment mark SAM2 may be arranged in the first direction (X-axis direction). The main alignment mark MAM and the second sub-alignment mark SAM2 may be arranged in the second direction (Y-axis direction). A distance between the first sub-alignment mark SAM1 and the second sub-alignment mark SAM2 may be smaller than a distance between the main alignment mark MAM and the second sub-alignment mark SAM2.

The main alignment mark MAM, the first sub-alignment mark SAM1, and the second sub-alignment mark SAM2 of the display cell DC located on the left side of the first cutting line CL1 may be bilaterally symmetrical with the main alignment mark MAM, the first sub-alignment mark SAM1, and the second sub-alignment mark SAM2 of the display cell DC located on the right side of the first cutting line CL1.

The display panel DP may include a display area DA including light emitting elements, a first dam DAM1, a second dam DAM2, and a non-display area NDA in which touch lines TL are located.

The touch lines TL may be located adjacent to the display area DA, and the second dam DAM2 may be located adjacent to the bubble discharge patterns BDP. The first dam DAM1 may be located between the touch line TL located at the outermost side of the touch lines TL and the second dam DAM2.

The touch lines TL may be connected to touch electrodes TE (see FIG. 12) located in the display area DA. The touch electrodes TE (see FIG. 12) may be electrically connected to a touch driving circuit of a circuit board connected to the display pads PD through the touch lines TL.

The first dam DAM1 and the second dam DAM2 are structures for preventing overflow of an organic encapsulation layer in an encapsulation layer for encapsulating the light emitting elements in the display area DA.

As shown in FIGS. 9 to 11, the bubble discharge passages BP, which are air passages from the edge of the display panel DP to the outside of the display cell DC, may be defined by the bubble discharge patterns BDP. Accordingly, when a pressure (e.g., predetermined pressure) is applied to the display cell DC in the bubble removal process, the bubbles BUB located between the top surface of the display panel DP and the upper protective film UPF may be discharged to the outside of the display cell DC through the bubble discharge passage BP. Therefore, because the bubbles BUB located between the top surface of the display panel DP and the upper protective film UPF can be reduced or eliminated, it is possible to reduce or prevent visual recognition of an image quality defect due to bubbles in the image quality inspection.

Figure 12:
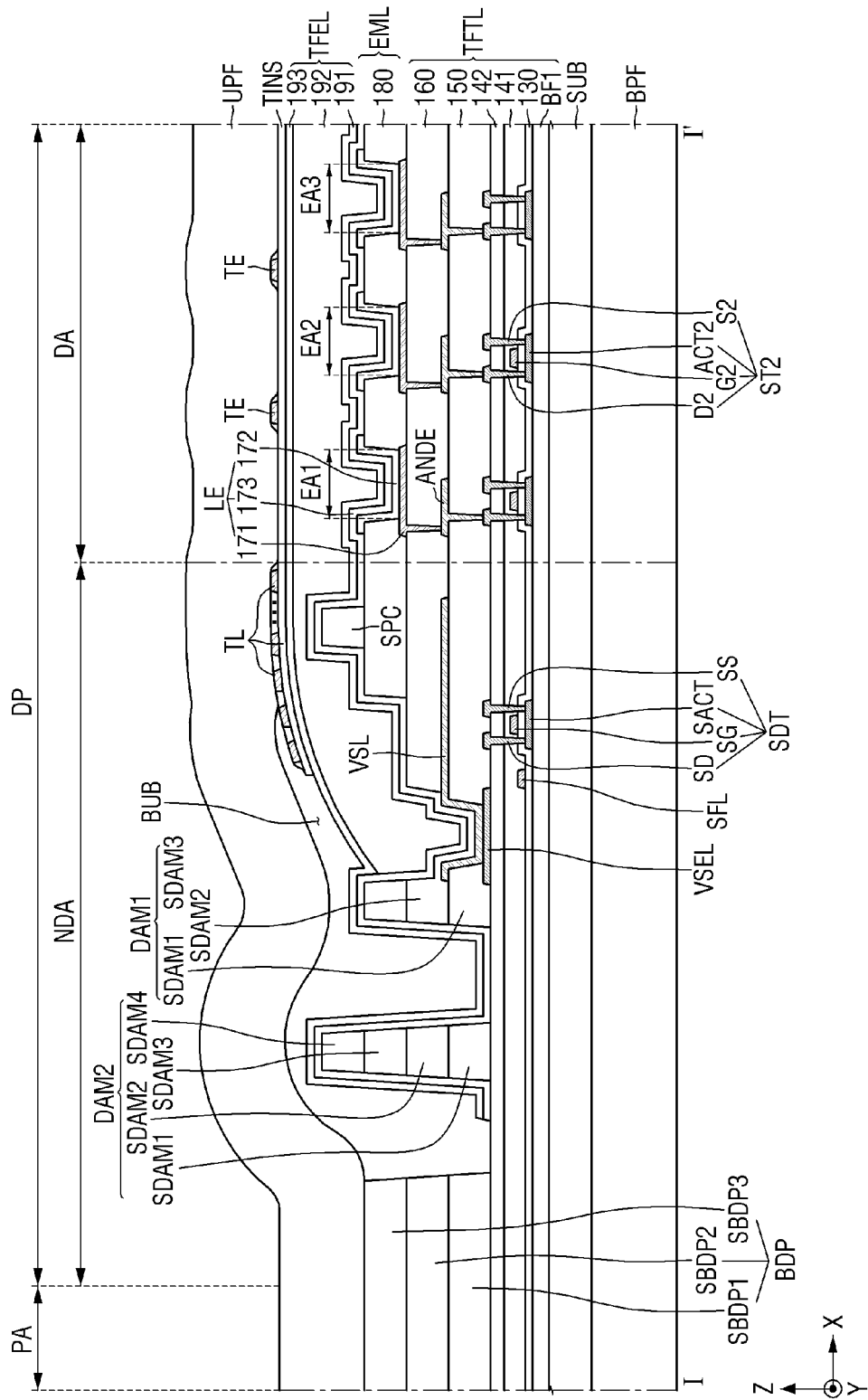
FIG. 12 is a cross-sectional view illustrating an example of a display cell taken along the line I-I' of FIG. 10.
Figure 13:
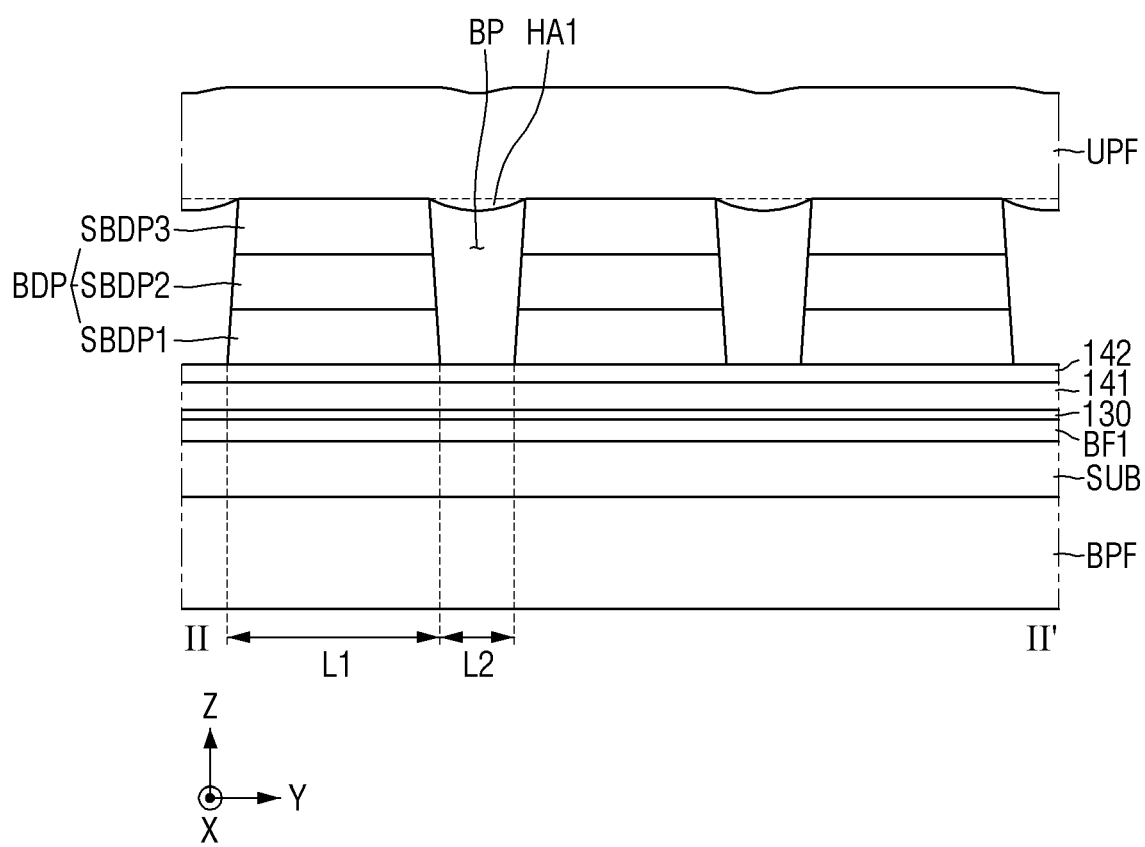
FIG. 13 is a cross-sectional view illustrating an example of a display cell taken along the line II-II' of FIG. 10.

FIG. 12 is a cross-sectional view illustrating an example of a display cell taken along the line I-I' of FIG. 10. FIG. 13 is a cross-sectional view illustrating an example of a display cell taken along the line II-II' of FIG. 10.

Referring to FIGS. 12 and 13, the display cell DC includes the display panel DP and the peripheral area PA. The display panel DP includes a substrate SUB, a thin film transistor layer TFTL, a light emitting element layer EML, and an encapsulation layer TFEL.

The substrate SUB may be made of an insulating material such as glass or plastic. For example, the substrate SUB may include polyimide. In this case, the substrate SUB may be a flexible substrate which can be bent, folded or rolled.

The lower protective film BPF may be located on the bottom surface of the substrate SUB. The lower protective film BPF may be made of an insulating material such as plastic.

The thin film transistor layer TFTL including pixel transistors ST2 and scan transistors SDT may be located on the top surface of the substrate SUB.

Each of the pixels PX may include at least one pixel transistor ST2 and a light emitting element LE. The pixel transistors ST2 may be transistors for driving the light emitting elements LE of the pixels PX.

The scan driver may include at least one scan transistor SDT. The scan transistor SDT may be a transistor that is electrically connected to a scan line of the display area DA to output scan signals.

The thin film transistor layer TFTL may include a pixel transistor ST2, a scan transistor SDT, a barrier layer BF1, a gate insulating layer 130, a first interlayer insulating layer 141, a second interlayer insulating layer 142, and a first planarization layer 150, and a second planarization layer 160.

The barrier layer BF1 may be located on the substrate SUB. The barrier layer BF1 may be formed of a silicon nitride layer, a silicon oxynitride layer, a silicon oxide layer, a titanium oxide layer, or an aluminum oxide layer.

The pixel transistor ST2 and the scan transistor SDT may be located on the barrier layer BF1. The pixel transistor ST2 may include an active layer ACT2, a gate electrode G2, a source electrode S2, and a drain electrode D2. The scan transistor SDT may include a scan active layer SACT, a scan gate electrode SG, a scan source electrode SS, and a scan drain electrode SD.

The active layer ACT2 of the pixel transistor ST2 and the scan active layer SACT of the scan transistor SDT may be located on the barrier layer BF1. The active layer ACT2 and the scan active layer SACT may include a silicon semiconductor such as polycrystalline silicon, monocrystalline silicon, low-temperature polycrystalline silicon, and amorphous silicon.

The portion of the active layer ACT2 overlapping the gate electrode G2 in the third direction (Z-axis direction) may be defined as a channel region of the pixel transistor ST2. Portions of the active layer ACT2 that do not overlap the gate electrode G2 in the third direction (Z-axis direction) may be defined as a conductive region of the pixel transistor ST2. The conductive region of the active layer ACT2 may have conductivity by doping a silicon semiconductor with ions or impurities.

The portion of the scan active layer SACT overlapping the scan gate electrode SG in the third direction (Z-axis direction) may be defined as a channel region of the scan transistor SDT. The portions of the scan active layer SACT that do not overlap the scan gate electrode SG in the third direction (Z-axis direction) may be defined as a conductive region of the scan transistor SDT. The conductive region of the scan active layer SACT may have conductivity by doping a silicon semiconductor with ions or impurities.

The gate insulating layer 130 may be located on the active layer ACT and the scan active layer SACT. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G2 of the pixel transistor ST2, and the scan gate electrode SG of the scan transistor SDT, may be located on the gate insulating layer 130. The gate electrode G2 of the pixel transistor ST2 may overlap the active layer ACT2 in the third direction (Z-axis direction). The scan gate electrode SG of the scan transistor SDT may overlap the scan active layer SACT in the third direction (Z-axis direction). The gate electrode G2 and the scan gate electrode SG may be formed as a single layer or as multiple layers made of any one of molybdenum (Mo), aluminum (Al), chromium (Cr), gold (Au), titanium (Ti), nickel (Ni), neodymium (Nd) and/or copper (Cu) or an alloy thereof.

The first interlayer insulating layer 141 may be located on the gate electrode G2 and the scan gate electrode SG. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may include a plurality of inorganic layers.

The second interlayer insulating layer 142 may be located on the first interlayer insulating layer 141. The second interlayer insulating layer 142 may be formed of an inorganic layer, for example, a silicon nitride layer, a silicon oxynitride layer, a silicon oxide layer, a titanium oxide layer, or an aluminum oxide layer.

On the second interlayer insulating layer 142, the source electrode S2 and the drain electrode D2 of the pixel transistor ST2, the source electrode SS and the drain electrode SD of the scan transistor SDT, and a first power connection line VSEL may be located. The source electrode S2 and the drain electrode D2 of the pixel transistor ST2, the source electrode SS and the drain electrode SD of the scan transistor SDT, and the first power connection line VSEL may be formed as a single layer or multiple layers made of any one of molybdenum (Mo), aluminum (Al), chromium (Cr), gold (Au), titanium (Ti), nickel (Ni), neodymium (Nd) and/or copper (Cu) or an alloy thereof.

The source electrode S2 of the pixel transistor ST2 may be connected to a conductive region located on one side of the active layer ACT2 through a contact hole penetrating the gate insulating layer 130, the first interlayer insulating layer 141, and the second interlayer insulating layer 142. The drain electrode D2 of the pixel transistor ST2 may be connected to a conductive region located on the other side of the active layer ACT2 through a contact hole penetrating the gate insulating layer 130, the first interlayer insulating layer 141, and the second interlayer insulating layer 142.

The scan source electrode SS of the scan transistor SDT may be connected to a conductive region located on one side of the scan active layer SACT through a contact hole penetrating the gate insulating layer 130, the first interlayer insulating layer 141, and the second interlayer insulating layer 142. The scan drain electrode SD of the scan transistor SDT may be connected to a conductive region located on the other side of the scan active layer SACT through a contact hole penetrating the gate insulating layer 130, the first interlayer insulating layer 141, and the second interlayer insulating layer 142.

The first planarization layer 150 may be located on the source electrode S2 and drain electrode D2 of the pixel transistor ST2, the source electrode SS and drain electrode SD of the scan transistor SDT, and the first power connection line VSEL to flatten a stepped portion due to the thin film transistors. The first planarization layer 150 may be formed of an organic layer such as acryl resin, epoxy resin, phenolic resin, polyamide resin, polyimide resin and/or the like.

A first connection electrode ANDE and a first power line VSL may be located on the first planarization layer 150. The first connection electrode ANDE may be connected to the source electrode S2 or the drain electrode D2 of the pixel transistor ST2 through a contact hole penetrating the first planarization layer 150. The first power line VSL may overlap the scan transistor SDT in the third direction (Z-axis direction). The first power line VSL may be connected to the first power connection line VSEL through a contact hole penetrating the first planarization layer 150. The first connection electrode ANDE and the first power line VSL may be formed as a single layer or multiple layers made of any one of molybdenum (Mo), aluminum (Al), chromium (Cr), gold (Au), titanium (Ti), nickel (Ni), neodymium (Nd) and/or copper (Cu) or an alloy thereof.

The second planarization layer 160 may be located on the first connection electrode ANDE and the first power line VSL. The second planarization layer 160 may be formed of an organic layer such as acryl resin, epoxy resin, phenolic resin, polyamide resin, polyimide resin and/or the like.

The light emitting element layer EML is located on the thin film transistor layer TFTL. The light emitting element layer EML may include the light emitting elements LE and a bank 180.

Each of the light emitting elements LE may include a pixel electrode 171, a light emitting layer 172, and a common electrode 173. Each of the emission areas EA1, EA2, and EA3 represents an area in which the pixel electrode 171, the light emitting layer 172, and the common electrode 173 are sequentially stacked, and holes from the pixel electrode 171 and electrons from the common electrode 173 may be combined with each other in the light emitting layer 172 to emit light. In this case, the pixel electrode 171 may be an anode electrode, and the common electrode 173 may be a cathode electrode.

The pixel electrode 171 may be located on the second planarization layer 160. The pixel electrode 171 may be connected to the first connection electrode ANDE through a contact hole penetrating the second planarization layer 160.

In a top emission structure that emits light toward the common electrode 173 with respect to the light emitting layer 172, the pixel electrode 171 may be formed of a single layer of molybdenum (Mo), titanium (Ti), copper (Cu), or aluminum (Al), or may be formed to have a laminated structure of aluminum and titanium (Ti/Al/Ti), a laminated structure of aluminum and ITO (ITO/Al/ITO), an APC alloy, or a laminated structure of APC alloy and ITO (ITO/APC/ITO) to increase the reflectivity. The APC alloy is an alloy of silver (Ag), palladium (Pd) and/or copper (Cu).

The bank 180 serves to define the emission areas EA1, EA2, and EA3 of the display pixels. To this end, the bank 180 may be formed to expose a partial region of the pixel electrode 171 on the second planarization layer 160. The bank 180 may cover the edge of the pixel electrode 171. The bank 180 may be located in a contact hole penetrating the second planarization layer 160. The bank 180 may be formed of an organic layer such as acryl resin, epoxy resin, phenolic resin, polyamide resin, polyimide resin and the like.

The emission areas EA1, EA2, and EA3 may emit light of different colors. For example, the first emission area EA1 may emit light of a first color, the second emission area EA2 may emit light of a second color, and the third emission area EA3 may emit light of a third color. The first color may be red, the second color may be green, and the third color may be blue, but embodiments of the present disclosure are not limited thereto.

The light emitting layer 172 is located on the pixel electrode 171. The light emitting layer 172 may include an organic material to emit light (e.g., light in a predetermined color). For example, the light emitting layer 172 may include a hole transporting layer, an organic material layer, and an electron transporting layer. The organic material layer may include a host and a dopant. The organic material layer may include a material that emits light (e.g., predetermined light), and may be formed using a phosphorescent material or a fluorescent material.

The common electrode 173 is located on the light emitting layer 172. The common electrode 173 may cover the light emitting layer 172. The common electrode 173 may be a common layer formed commonly to the display pixels. A capping layer may be formed on the common electrode 173.

In the top emission structure, the common electrode 173 may be formed of a transparent conductive material (TCO) such as ITO or IZO capable of transmitting light or a semi-transmissive conductive material such as magnesium (Mg), silver (Ag), or an alloy of magnesium (Mg) and/or silver (Ag). When the common electrode 173 is formed of a semi-transmissive conductive material, the light emission efficiency can be increased due to a micro-cavity effect.

A spacer SPC on which a mask for depositing the light emitting layer 172 is placed during a manufacturing process may be located on the bank 180. The spacer SPC may be formed of an organic layer such as acryl resin, epoxy resin, phenolic resin, polyamide resin, polyimide resin and/or the like.

The encapsulation layer TFEL may be formed on the light emitting element layer EML. The encapsulation layer TFEL may include at least one inorganic layer to reduce or prevent permeation of oxygen or moisture into the light emitting element layer EML. In addition, the encapsulation layer TFEL may include at least one organic layer to protect the light emitting element layer EML from foreign particles.

For example, the encapsulation layer TFEL may include a first inorganic encapsulation layer 191 located on the common electrode 173, an organic encapsulation layer 192 located on the first inorganic encapsulation layer 191, and a second inorganic encapsulation layer 193 located on the organic encapsulation layer 192. The first inorganic encapsulation layer 191 and the second inorganic encapsulation layer 193 may be formed of multiple layers in which one or more inorganic layers of a silicon nitride layer, a silicon oxynitride layer, a silicon oxide layer, a titanium oxide layer, and/or an aluminum oxide layer are alternately stacked. The organic layer may include acryl resin, epoxy resin, phenolic resin, polyamide resin, or polyimide resin.

A touch insulating layer TINS may be located on the encapsulation layer TFEL. The touch insulating layer TINS may be formed of an inorganic layer, for example, a silicon nitride layer, a silicon oxynitride layer, a silicon oxide layer, a titanium oxide layer, or an aluminum oxide layer.

The touch electrodes TE and the touch lines TL may be located on the touch insulating layer TINS. The touch electrodes TE may be located in the display area DA, and the touch lines TL may be located in the non-display area NDA.

The touch electrodes TE may overlap the bank 180 in the third direction (Z-axis direction). Therefore, the touch electrodes TE might not overlap the emission areas EA1, EA2, and EA3. Accordingly, because light emitted from the emission areas EA1, EA2, and EA3 might be not blocked by the touch electrodes TE, it is possible to prevent or reduce a decrease in luminance of light.

The touch electrodes TE may be driven by a mutual capacitance method including two types of touch electrodes (e.g., driving electrodes and sensing electrodes) to sense a user's touch. In this case, by applying touch driving signals to the driving electrodes and sensing a charge change amount of the mutual capacitance formed between the driving electrodes and the sensing electrodes through the sensing electrodes, it is possible to determine whether a touch is inputted.

Alternatively, the touch electrodes TE may be driven by a self-capacitance method including one type of touch electrode. In this case, by applying touch driving signals to the touch electrodes TE and sensing a charge change amount of the self-capacitance of the touch electrodes TE, it is possible to determine whether a touch is inputted.

Because the touch lines TL and the scan transistor SDT are located between the display area DA and the first dam DAM1 in the non-display area NDA, any one of the touch lines TL may overlap the scan transistor SDT in the third direction (Z-axis direction). Further, the touch line TL may overlap the first power line VSL in the third direction (Z-axis direction).

To reduce or prevent the likelihood of the organic encapsulation layer 192 of the encapsulation layer TFE overflowing, the first dam DAM1 and the second dam DAM2 may be located at the edge of the display panel DP. The first inorganic encapsulation layer 191 and the second inorganic encapsulation layer 193 may be located on the first dam DAM1 and the second dam DAM2. The organic encapsulation layer 192 may be located on the first dam DAM1 and the second dam DAM2. Alternatively, the organic encapsulation layer 192 may be located on the first dam DAM1, but the organic encapsulation layer 192 might not be located on the second dam DAM2.

The first dam DAM1 may be located outside the first power line VSL. The first dam DAM1 may include a first sub-dam SDAM1 formed of the same material as the first planarization layer 150, a second sub-dam SDAM2 formed of the same material as the second planarization layer 160, and a third sub-dam SDAM3 formed of the same material as the bank 180.

The second dam DAM2 may be located outside the first dam DAM1. The second dam DAM2 may be a dam for confining the organic encapsulation layer 192 beyond the first dam DAM1. The second dam DAM2 may include a first sub-dam SDAM1 formed of the same material as the first planarization layer 150, a second sub-dam SDAM2 formed of the same material as the second planarization layer 160, a third sub-dam SDAM3 formed of the same material as the bank 180, and a fourth sub-dam SDAM4 formed of the same material as the spacer SPC. The height of the second dam DAM2 may be higher than, or greater, the height of the first dam DAM1.

The bubble discharge patterns BDP may be located outside the second dam DAM2. The first inorganic encapsulation layer 191, the organic encapsulation layer 192, and the second inorganic encapsulation layer 193 might not be located on the bubble discharge patterns BDP. When the display cell DC is cut along the second cutting line CL2, the bubble discharge patterns BDP of the display panel DP may be part of the bubble discharge patterns BDP of the display cell DC remaining on the display panel DP.

The bubble discharge patterns BDP may include a first sub-pattern SBDP1 formed of the same material as the first planarization layer 150, a second sub-pattern SBDP2 formed of the same material as the second planarization layer 160, and a third sub-pattern SBDP3 formed of the same material as the bank 180, but the embodiments of the present disclosure is not limited thereto. For example, the bubble discharge pattern BDP may include at least one of the first sub-pattern SBDP1, the second sub-pattern SBDP2, or the third sub-pattern SBDP3.

Because the first planarization layer 150, the second planarization layer 160, and the bank 180 are formed of an organic layer, the bubble discharge pattern BDP may be formed of an organic layer. Therefore, the bubble discharge pattern BDP may be collectively referred to as an organic pattern. In this case, it should be noted that the organic pattern refers to a pattern including an organic layer, and does not mean a pattern consisting only of an organic layer.

The upper protective film UPF may be located on the display cell DC. The upper protective film UPF may be located on the touch electrodes TE, the touch lines TL, the first dam DAM1, the second dam DAM2, and the bubble discharge pattern BDP. Because an insulating layer for flattening a stepped portion due to the touch electrodes TE and the touch lines TL is not located on the touch electrodes TE and the touch lines TL, the upper protective film UPF may contact the touch electrodes TE, the touch lines TL, the first dam DAM1, the second dam DAM2, and the bubble discharge pattern BDP.

Because the insulating layer for flattening the stepped portion due to the touch lines TL is not located on the touch lines TL, the bubbles BUB may be generated between the display cell DC and the upper protective film UPF in the region where the touch lines TL, the first dam DAM1, and the second dam DAM2 are located. The bubbles BUB may be connected to the outside of the display cell DC through the bubble discharge passages BP defined by the bubble discharge patterns BDP. Therefore, when a pressure (e.g., predetermined pressure) is applied to the display cell DC in the bubble removal process, the bubbles BUB may be discharged to the outside of the display cell DC through the bubble discharge passages BP. In the bubble removal process, about 8 atmospheric pressure may be applied to the display cell DC at approximately 50° C. for a period (e.g., a predetermined period).

In summary, when the insulating layer for flattening the stepped portion due to the touch lines TL is omitted to be not located on the touch wires TL, the bubbles BUB may occur between the display cell DC and the upper protective film UPF. However, the bubbles BUB may be discharged to the outside of the display cell DC through the bubble discharge passages BP. Accordingly, because a process of forming an insulating layer for flattening a stepped portion due to the touch lines TL may be omitted, the manufacturing cost can be reduced.

Figure 14:
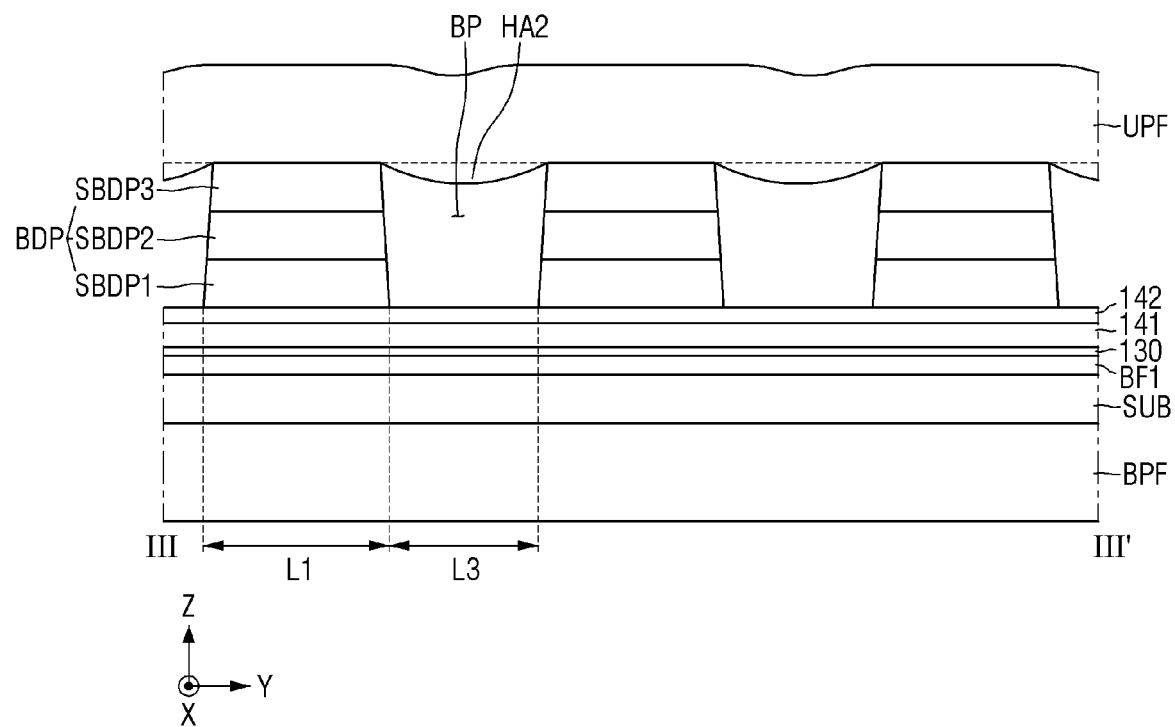
FIG. 14 is a cross-sectional view illustrating still another example of a display cell taken along the line II-II' of FIG. 10.

FIG. 14 is a cross-sectional view illustrating still another example of a display cell taken along the line II-II' of FIG. 10.

Hereinafter, a length L1 of the bubble discharge pattern BDP in the second direction (Y-axis direction), and a length L2/L3 of the bubble discharge passage BP of the second direction (Y-axis direction) will be described with reference to FIGS. 13 and 14. The length L1 of the bubble discharge pattern BDP in the second direction (Y-axis direction) may be the width of the bubble discharge pattern BDP, and the length L2/L3 of the bubble discharge passage BP in the second direction (Y-axis direction) may be the width of the bubble discharge passage BP.

Referring to FIGS. 13 and 14, the length L1 of the bubble discharge pattern BDP in the second direction (Y-axis direction) may be greater than the length L2/L3 of the bubble discharge passage BP in the second direction (Y-axis direction). The length L1 of the bubble discharge pattern BDP in the second direction (Y-axis direction) may be greater than about 200 μm. For example, the length L1 of the bubble discharge pattern BDP in the second direction (Y-axis direction) may be approximately 220 μm.

FIG. 13 illustrates that the length L2 of the bubble discharge passage BP in the second direction (Y-axis direction) is about 50 μm, and FIG. 14 illustrates that the length L3 of the bubble discharge passage BP in the second direction (Y-axis direction) is about 200 μm.

The smaller the length L2/L3 of the bubble discharge passage BP in the second direction (Y-axis direction), the smaller the area of the bubble discharge passage BP, but a sagging area HA1/HA2 of the upper protective film UPF in the bubble discharge passage BP may be reduced, or smaller. The larger the length L2/L3 of the bubble discharge passage BP in the second direction (Y-axis direction), the larger the area of the bubble discharge passage BP, but the sagging area HA1/HA2 of the upper protective film UPF in the bubble discharge passage BP may be increased, or larger.

If the length L2/L3 of the bubble discharge passage BP in the second direction (Y-axis direction) is less than about 50 μm, the area of the bubble discharge passage BP becomes smaller, which may make it difficult to discharge the bubbles BUB. In addition, when the length L2/L3 of the bubble discharge passage BP in the second direction (Y-axis direction) is about 200 μm or more, because the sagging area HA1/HA2 of the upper protective film UPF becomes large, the area of the bubble discharge passage BP becomes small, which may make it difficult to discharge the bubbles BUB. Therefore, it is preferable that the length L2/L3 of the bubble discharge passage BP in the second direction (Y-axis direction) is between about 50 μm to about 200 μm.

Figure 15:
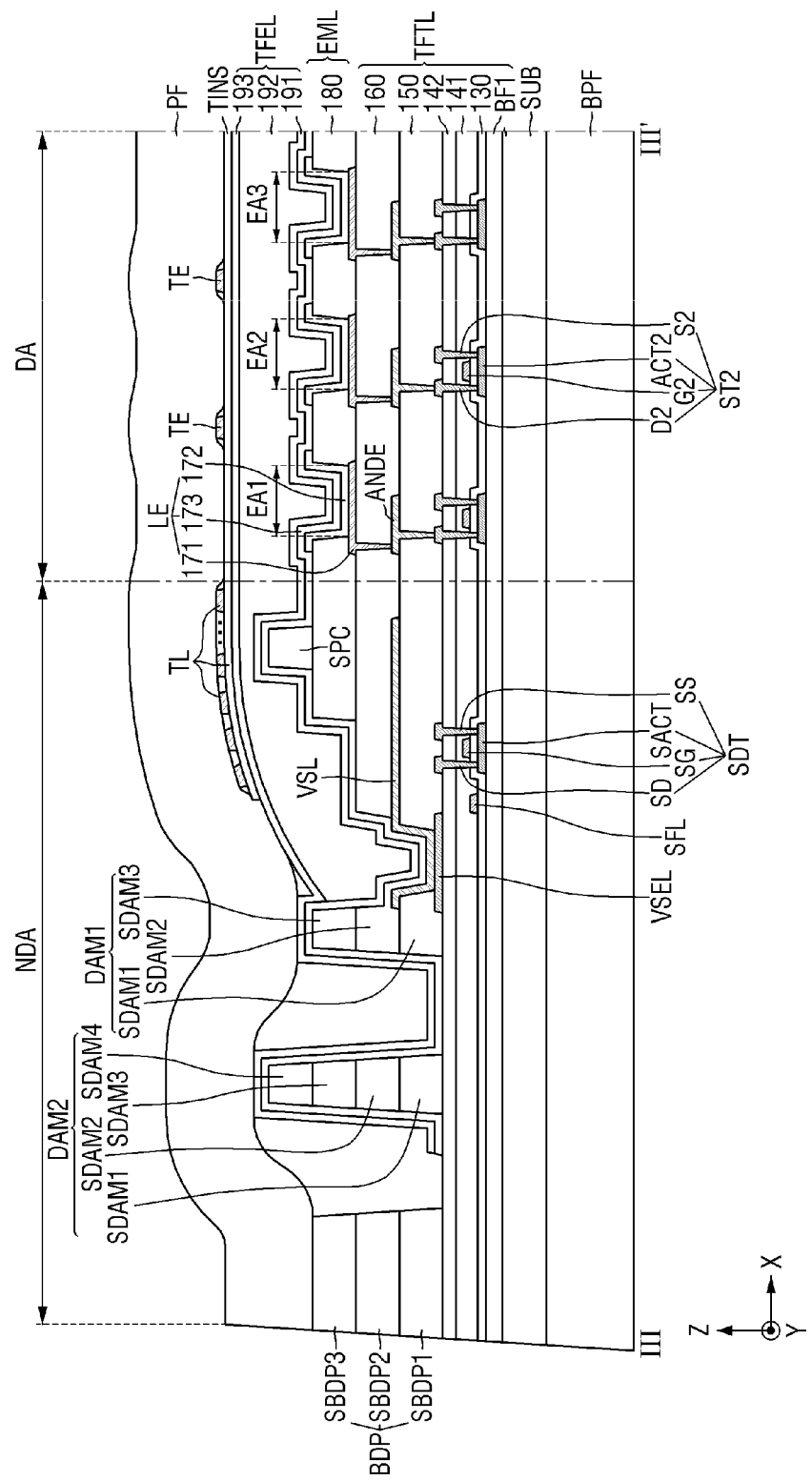
FIG. 15 is a cross-sectional view illustrating an example of a display panel taken along the line III-III' of FIG. 11.
Figure 16:
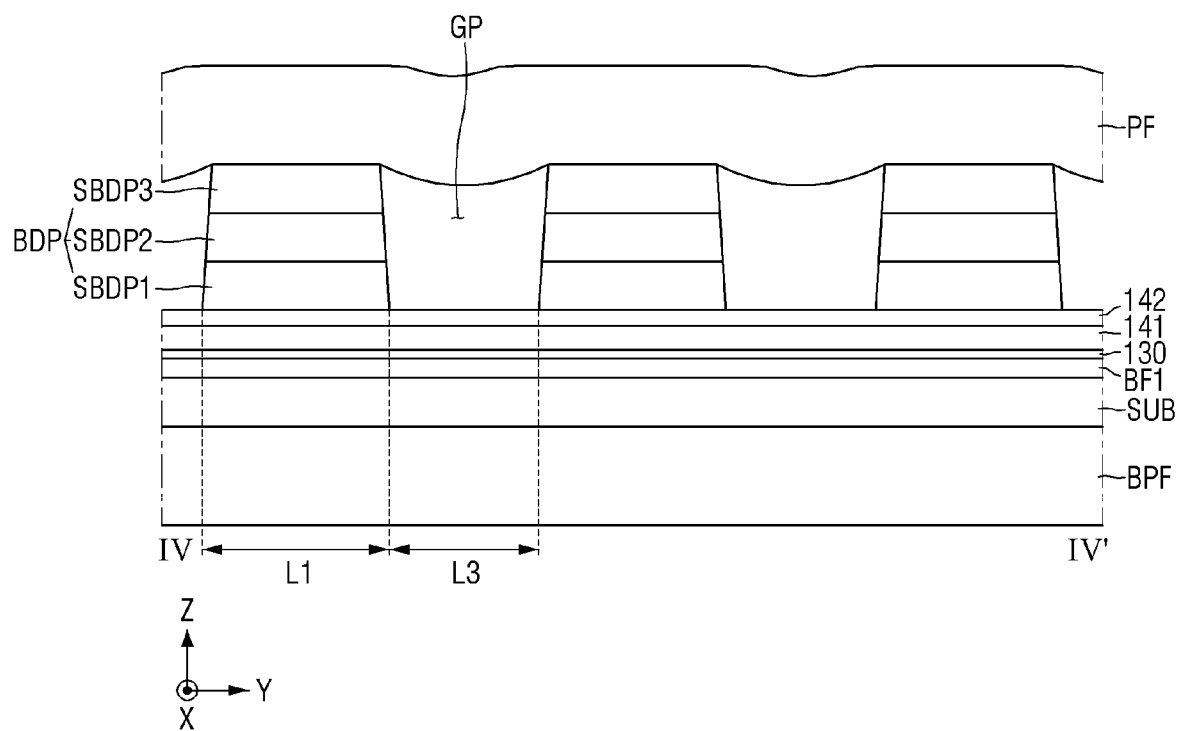
FIG. 16 is a cross-sectional view illustrating an example of a display panel taken along the line IV-IV' of FIG. 11.

FIG. 15 is a cross-sectional view illustrating an example of a display panel taken along the line III-III' of FIG. 11. FIG. 16 is a cross-sectional view illustrating an example of a display panel taken along the line IV-IV' of FIG. 11.

Because the embodiments of FIGS. 15 and 16 differ only in that instead of the upper protective film UPF, the polarizing film PF is attached onto the display panel DP, in the description made with reference to FIGS. 15 and 16, redundant parts of the description with reference to FIGS. 12 and 13 will be omitted.

Referring to FIGS. 15 and 16, the polarizing film PF may be located on the display panel DP. The polarizing film PF may be located on the touch electrodes TE, the touch lines TL, the first dam DAM1, the second dam DAM2, and the bubble discharge pattern BDP. Because an insulating layer for flattening a stepped portion due to the touch electrodes TE and the touch lines TL is not located on the touch electrodes TE and the touch lines TL, the polarizing film PF may contact the touch electrodes TE, the touch lines TL, the first dam DAM1, the second dam DAM2, and the bubble discharge pattern BDP.

The length of the bubble discharge pattern BDP in the second direction (Y-axis direction) may be larger than that of the gap GP in the second direction (Y-axis direction). For example, the length of the bubble discharge pattern BDP in the second direction (Y-axis direction) may be greater than about 200 µm. The length of the gap GP in the second direction (Y-axis direction) may be between about 50 µm to about 200 µm.

Figure 17:
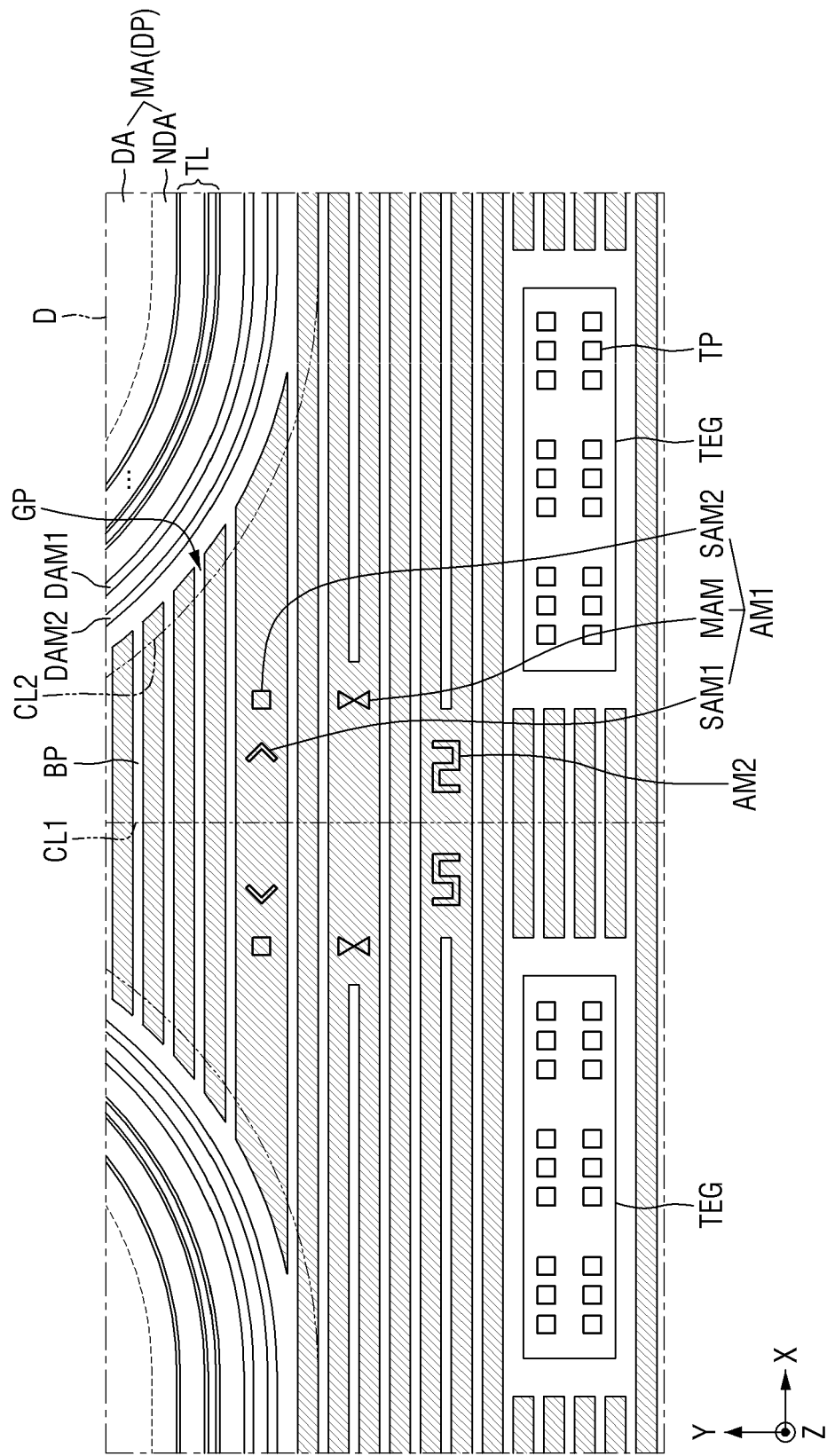
FIG. 17 is a layout diagram showing in detail an example of area D of FIG. 5.
Figure 18:
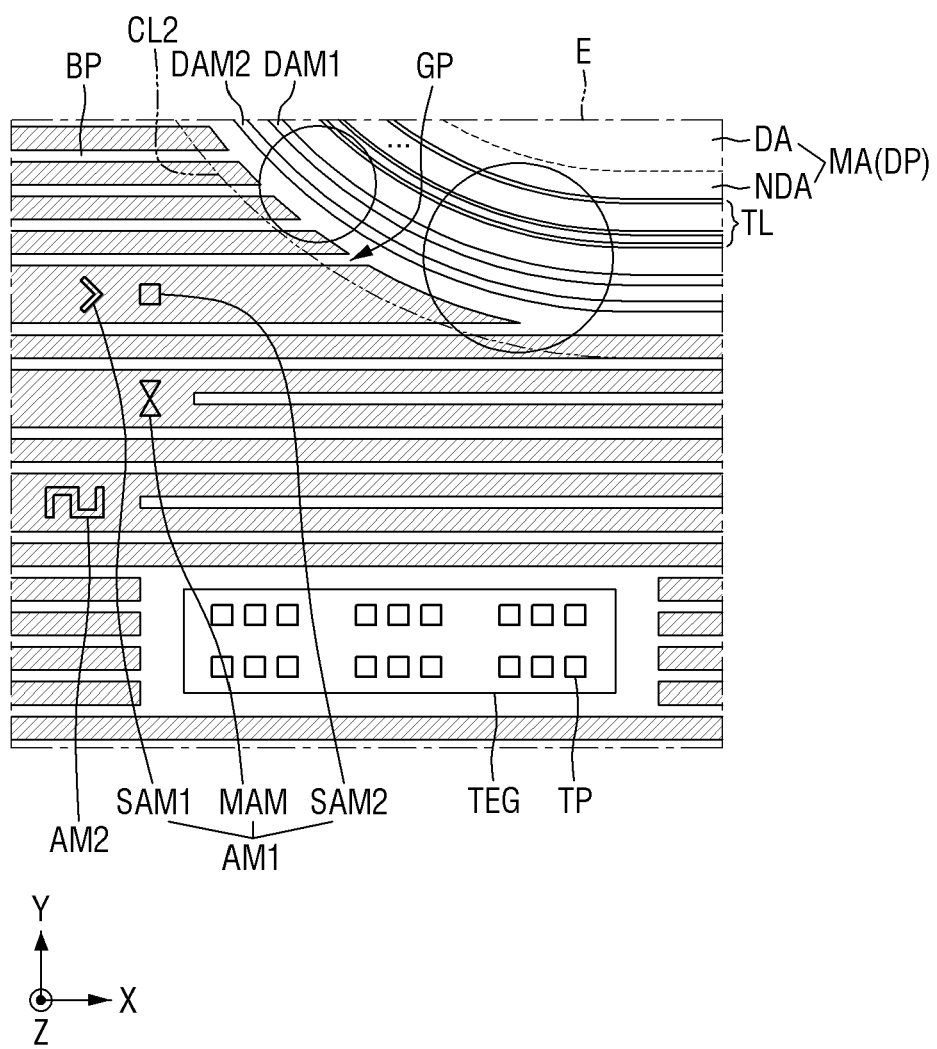
FIG. 18 is a layout diagram showing in detail an example of area E of FIG. 6.

FIG. 17 is a layout diagram showing in detail an example of area D of FIG. 5. FIG. 18 is a layout diagram showing in detail an example of a right half area of FIG. 17.

The embodiments of FIGS. 17 and 18 differs from the embodiments of FIGS. 9 and 10 in that each of the display cells DC further includes a second alignment mark AM2 and the test pad area TEG. In the description made with reference to FIGS. 17 and 18, redundant parts of the description with reference to FIGS. 9 and 10 will be omitted.

Referring to FIGS. 17 and 18, the second alignment mark AM2 may be located in the peripheral area PA. The second alignment mark AM2 may be a mark used to cut the mother substrate BS along the first cutting line CL1.

When the second alignment mark AM2 is located in the bubble discharge passage BP, the second alignment mark AM2 might not be visible due to bubbles. Therefore, the second alignment mark AM2 may be suitably located outside of the bubble discharge passage BP. That is, the second alignment mark AM2 may overlap the bubble discharge patterns BDP without overlapping the bubble discharge passage BP. In this case, the length of the second direction (Y-axis direction) of the bubble discharge pattern BDP overlapping the second alignment mark AM2 may be greater than the length of the bubble discharge pattern BDP that does not overlap the first alignment marks AM1 or the second alignment mark AM2.

Although it is illustrated that the second alignment mark AM2 has a planar shape of the number "5" or "2" inclined in the first direction (X-axis direction), the planar shape of the second alignment mark AM2 is not limited thereto.

The length of the second alignment mark AM2 in the first direction (X-axis direction) may be greater than the length of the main alignment mark MAM in the first direction (X-axis direction), the length of the first sub-alignment mark SAM1 in the first direction (X-axis direction), and the length of the second sub-alignment mark SAM2 in the first direction (X-axis direction).

The second alignment mark AM2 and the first sub-alignment mark SAM1 may be arranged in the second direction (Y-axis direction). A distance between the second alignment mark AM2 and the first sub-alignment mark SAM1 may be greater than a distance between the main alignment mark MAM and the second sub-alignment mark SAM2. The second alignment mark AM2 of the display cell DC located on the left side of the first cutting line CL1 may be bilaterally symmetrical with the second alignment mark AM2 of the display cell DC located on the right side of the first cutting line CL1.

The test pad area TEG may be located in the peripheral area PA. The test pad area TEG may include test pads electrically connected to display pads PD of the display panel DP. Accordingly, voltages applied to the test pads in the test pad area TEG may be applied to the wirings through the display pads PD of the display panel DP.

Because the test pads TP in the test pad area TEG must be connected to the image quality inspection equipment, they might not be covered by the bubble discharge patterns BDP. That is, the test pad area TEG might not overlap the bubble discharge patterns BDP.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display panel comprising:
   a substrate;
   light emitting elements in a display area of the substrate, and configured to emit light;
   an organic encapsulation layer on the light emitting elements;
   a first dam in a non-display area of the substrate; and
   organic patterns spaced apart from each other, and extending from outside the first dam in the non-display area of the substrate to an edge of the substrate, and comprising a first organic pattern and a second organic pattern adjacent to each other and having a gap therebetween, the gap extending lengthwise from outside the first dam to the edge of the substrate, and
   wherein the organic patterns are disposed at an edge of the substrate, and
   wherein the substrate comprises a first side, a second side, and a corner where the first side and the second side meet in plan view, and
   wherein the organic patterns are at the corner in plan view.

2. The display panel of claim 1, wherein the organic patterns are arranged along an edge of the substrate.

3. The display panel of claim 1, wherein the organic patterns comprise an organic material.

4. The display panel of claim 1, wherein a length of the first organic pattern in one direction is greater than a length of the gap in the one direction.

5. The display panel of claim 1, further comprising touch lines within an inner side of the first dam in the non-display area and on the organic encapsulation layer.

6. The display panel of claim 5, further comprising a polarizing film on and contacting the touch lines.

7. The display panel of claim 1, further comprising:
   a pixel transistor on the substrate and in the display area;
   a first planarization layer on the pixel transistor; and
   a second planarization layer on the first planarization layer.

8. The display panel of claim 7, further comprising a bank, wherein each of the light emitting elements comprises:
   a pixel electrode on the second planarization layer;
   a light emitting layer on the pixel electrode; and
   a common electrode on the light emitting layer, and
   wherein the bank is on the pixel electrode.

9. The display panel of claim 8, wherein each of the organic patterns comprises a first sub-pattern having a same material as the first planarization layer.

10. The display panel of claim 9, wherein each of the organic patterns comprises a second sub-pattern on the first sub-pattern and having a same material as the second planarization layer.

11. The display panel of claim 10, wherein each of the organic patterns comprises a third sub-pattern on the second sub-pattern and having a same material as the bank.

12. The display panel of claim 11, wherein the first dam comprises:
- a first sub-dam having a same material as the first sub-pattern;
- a second sub-dam on the first sub-dam and having a same material as the second sub-pattern; and
- a third sub-dam on the second sub-dam and having a same material as the third sub-pattern.

13. The display panel of claim 12, further comprising a second dam in the non-display area of the substrate between the first dam and the organic pattern,
wherein the second dam comprises:
- a first sub-dam having a same material as the first sub-pattern;
- a second sub-dam on the first sub-dam and having a same material as the second sub-pattern;
- a third sub-dam on the second sub-dam and having a same material as the third sub-pattern; and
- a fourth sub-dam on the third sub-dam.

14. The display panel of claim 13, further comprising a spacer on the bank and having a same material as the fourth sub-dam.

15. The display panel of claim 1, wherein the organic encapsulation layer is on the first dam, and is not on the organic patterns.

16. The display device of claim 1, wherein a minimum distance of the gap in a first direction which is a lengthwise direction is smaller than a minimum distance of the gap in a second direction perpendicular to the first direction.

17. The display device of claim 1, wherein lengths of the organic patterns extending according to a round edge of the corner increases from the first side to the second side.

* * * * *